(12) United States Patent
Sheng et al.

(10) Patent No.: US 8,407,022 B2
(45) Date of Patent: *Mar. 26, 2013

(54) REAL-TIME DYNAMIC TRACKING OF BIAS

(75) Inventors: Hua Sheng, Rockville, MD (US);
Matthew G. Liberty, Gaithersburg, MD (US); Christopher D. Roller, Baltimore, MD (US); Charles W. K. Gritton, Sterling, VA (US)

(73) Assignee: Hillcrest Laboratories, Inc., Rockville, MD (US)

( * ) Notice: Subject to any disclaimer, the term of this patent is extended or adjusted under 35 U.S.C. 154(b) by 153 days.

This patent is subject to a terminal disclaimer.

(21) Appl. No.: 12/971,791

(22) Filed: Dec. 17, 2010

(65) Prior Publication Data
US 2011/0095979 A1    Apr. 28, 2011

Related U.S. Application Data

(63) Continuation of application No. 12/163,229, filed on Jun. 27, 2008, now Pat. No. 7,860,676.

(60) Provisional application No. 60/937,596, filed on Jun. 28, 2007.

(51) Int. Cl.
*G01D 3/028* (2006.01)
*G01R 29/00* (2006.01)
*G06F 19/00* (2011.01)

(52) U.S. Cl. ............. 702/87; 73/1.01; 73/1.75; 73/1.79; 73/1.88; 709/92; 709/94; 709/104; 709/150

(58) Field of Classification Search ............. 73/1.01, 73/1.37, 1.38, 1.75, 1.77, 1.78, 1.79, 488, 73/504.02, 504.03, 504.08, 504.18, 510, 73/511, 514.01, 514.02, 514.15, 570, 649, 73/652; 702/1, 85, 87, 92, 94, 104, 127, 702/141, 150, 151, 152, 153, 189, 154
See application file for complete search history.

(56) References Cited

U.S. PATENT DOCUMENTS

| 4,678,935 | A | * | 7/1987 | Nawata et al. ................. 326/43 |
| 4,787,051 | A | | 11/1988 | Olson |
| 4,839,838 | A | | 6/1989 | LaBiche et al. |
| 5,045,843 | A | | 9/1991 | Hansen |
| 5,128,671 | A | | 7/1992 | Thomas, Jr. |
| 5,138,154 | A | | 8/1992 | Hotelling |
| 5,181,181 | A | | 1/1993 | Glynn |
| 5,359,348 | A | | 10/1994 | Pilcher et al. |
| 5,396,265 | A | | 3/1995 | Ulrich et al. |

(Continued)

FOREIGN PATENT DOCUMENTS

| EP | 0919906 A2 | 6/1999 |
| WO | 96 11435 A1 | 4/1996 |

(Continued)

OTHER PUBLICATIONS

IEEE Standards, "802.16 IEEE Standard for Local and Metropolitan Area Networks, Part 16: Air Interface for Fixed Broadband Wireless Access Systems," IEEE Std 802.16/2004, Oct. 1, 2004, pp. 1-857.

(Continued)

*Primary Examiner* — Edward Cosimano
(74) *Attorney, Agent, or Firm* — Potomac Patent Group PLLC

(57) ABSTRACT

A bias value associated with a sensor, e.g., a time-varying, non-zero value which is output from a sensor when it is motionless, is estimated using at least two, different bias estimating techniques. A resultant combined or selected bias estimate may then be used to compensate the biased output of the sensor in, e.g., a 3D pointing device.

20 Claims, 9 Drawing Sheets

U.S. PATENT DOCUMENTS

| | | | |
|---|---|---|---|
| 5,440,326 A | 8/1995 | Quinn | |
| 5,453,758 A | 9/1995 | Sato | |
| 5,484,355 A | 1/1996 | King, II et al. | |
| 5,506,605 A | 4/1996 | Paley | |
| 5,554,980 A | 9/1996 | Hashimoto et al. | |
| 5,698,784 A | 12/1997 | Hotelling et al. | |
| 5,703,623 A | 12/1997 | Hall et al. | |
| 5,757,360 A | 5/1998 | Nitta et al. | |
| 5,796,354 A | 8/1998 | Cartabiano et al. | |
| 5,819,206 A | 10/1998 | Horton et al. | |
| 5,825,350 A | 10/1998 | Case, Jr. et al. | |
| 5,835,156 A | 11/1998 | Blonstein et al. | |
| 5,898,421 A | 4/1999 | Quinn | |
| 5,912,612 A | 6/1999 | DeVolpi | |
| 5,955,988 A | 9/1999 | Blonstein et al. | |
| 6,002,394 A | 12/1999 | Schein et al. | |
| 6,016,144 A | 1/2000 | Blonstein et al. | |
| 6,049,823 A | 4/2000 | Hwang | |
| 6,069,594 A | 5/2000 | Barnes et al. | |
| 6,115,028 A | 9/2000 | Balakrishnan et al. | |
| 6,164,808 A | 12/2000 | Shibata et al. | |
| 6,191,774 B1 | 2/2001 | Schena et al. | |
| 6,369,794 B1 | 4/2002 | Sakurai et al. | |
| 6,400,996 B1 | 6/2002 | Hoffberg et al. | |
| 6,433,615 B2* | 8/2002 | Nagano et al. | 327/513 |
| 6,466,198 B1 | 10/2002 | Feinstein | |
| 6,466,831 B1 | 10/2002 | Shibata et al. | |
| 6,473,713 B1 | 10/2002 | McCall et al. | |
| 6,492,981 B1 | 12/2002 | Stork et al. | |
| 6,539,297 B2* | 3/2003 | Weiberle et al. | 701/29.7 |
| 6,544,126 B2 | 4/2003 | Sawano et al. | |
| 6,650,313 B2 | 11/2003 | Levine et al. | |
| 6,653,831 B2* | 11/2003 | Friend et al. | 324/244 |
| 6,672,962 B1 | 1/2004 | Ozaki et al. | |
| 6,753,849 B1 | 6/2004 | Curran et al. | |
| 6,757,446 B1 | 6/2004 | Li et al. | |
| 6,929,548 B2 | 8/2005 | Wang | |
| 6,933,923 B2 | 8/2005 | Feinstein | |
| 6,984,208 B2 | 1/2006 | Zheng | |
| 6,990,639 B2 | 1/2006 | Wilson | |
| 6,998,966 B2 | 2/2006 | Pederson et al. | |
| 7,053,608 B2* | 5/2006 | Friend et al. | 324/244 |
| 7,098,891 B1 | 8/2006 | Pryor | |
| 7,118,518 B1* | 10/2006 | Teeter | 482/144 |
| 7,158,118 B2 | 1/2007 | Liberty | |
| 7,173,604 B2 | 2/2007 | Marvit et al. | |
| 7,188,045 B1 | 3/2007 | Cirielli | |
| 7,236,156 B2 | 6/2007 | Liberty et al. | |
| 7,239,301 B2 | 7/2007 | Liberty et al. | |
| 7,262,760 B2 | 8/2007 | Liberty | |
| 7,289,924 B2* | 10/2007 | Muniraju et al. | 702/107 |
| 7,353,134 B2 | 4/2008 | Cirielli | |
| 7,414,611 B2 | 8/2008 | Liberty | |
| 7,860,676 B2* | 12/2010 | Sheng et al. | 702/85 |
| 2001/0040241 A1* | 11/2001 | Nagano et al. | 257/159 |
| 2002/0072836 A1* | 6/2002 | Weiberle et al. | 701/34 |
| 2002/0158843 A1 | 10/2002 | Levine et al. | |
| 2003/0094942 A1* | 5/2003 | Friend et al. | 324/244 |
| 2003/0107551 A1 | 6/2003 | Dunker | |
| 2003/0159051 A1 | 8/2003 | Hollnagel | |
| 2003/0193572 A1 | 10/2003 | Wilson et al. | |
| 2004/0080316 A1* | 4/2004 | Friend et al. | 324/244 |
| 2004/0095317 A1 | 5/2004 | Zhang et al. | |
| 2004/0193413 A1 | 9/2004 | Wilson et al. | |
| 2004/0204240 A1 | 10/2004 | Barney | |
| 2004/0229693 A1 | 11/2004 | Lind et al. | |
| 2004/0239626 A1 | 12/2004 | Noguera | |
| 2004/0268393 A1 | 12/2004 | Hunleth et al. | |
| 2005/0008148 A1 | 1/2005 | Jacobson | |
| 2005/0125826 A1 | 6/2005 | Hunleth et al. | |
| 2005/0174324 A1 | 8/2005 | Liberty et al. | |
| 2005/0212767 A1 | 9/2005 | Marvit et al. | |
| 2005/0243062 A1 | 11/2005 | Liberty | |
| 2005/0253806 A1 | 11/2005 | Liberty et al. | |
| 2006/0028446 A1 | 2/2006 | Liberty et al. | |
| 2006/0092133 A1 | 5/2006 | Touma et al. | |
| 2006/0262116 A1 | 11/2006 | Moshiri | |
| 2007/0032974 A1* | 2/2007 | Muniraju et al. | 702/85 |
| 2007/0035518 A1 | 2/2007 | Francz | |
| 2009/0033807 A1* | 2/2009 | Sheng et al. | 348/734 |

FOREIGN PATENT DOCUMENTS

| | | |
|---|---|---|
| WO | 01 78055 | 10/2001 |
| WO | 03 048909 A2 | 6/2003 |
| WO | 2005 099166 A2 | 10/2005 |

OTHER PUBLICATIONS

Ang, W. T., et al., "Physical Model of a MEMS Accelerometer for Low-g Motion Tracking Applications," Proceedings of the 2004 IEEE International Conference on Robotics & Automation, Apr. 2004, pp. 1345-1351.

Bachmann, E. R, "Inertial and Magnetic Tracking of Limb Segment Orientation for Inserting Humans into Synthetic Environments," Dissertation, Naval Postgraduate School, Monterey, California, Dec. 2000, pp. 1-178.

Bachmann, E. R., et al., "Orientation Tracking for Humans and Robots Using Inertial Sensors," IEEE International Symposium on Computational Intelligence in Robotics and Automation, CIRA '99 Proceedings, 1999, pp. 187-194.

Bachmann, E. R., et al., "Design and Implementation of MARG Sensors for 3-DOF Orientation Measurement of Rigid Bodies," IEEE International Conference on Robotics and Automation, ICRA '03, Sep. 2003, vol. 1, pp. 1171-1178.

Baerveldt, A-J., et al., "A Low-Cost and Low-Weight Attitude Estimation System for an Autonomous Helicopter," 1997 IEEE International Conference on Intelligent Engineering Systems, INES '97 Proceedings, Sep. 1997, pp. 391-395.

Barshan, B., et al., "Inertial Navigation Systems for Mobile Robots," IEEE Transactions on Robotics and Automation, vol. 11, No. 3, Jun. 1995, pp. 328-342.

Bibi, F., et al., "Modeling and Simulation of Bias Uncertainty of Gyroscope for Improved Navigation," 2nd International Bhurban Conference on Applied Sciences and Technology, Bhurban, Pakistan, Jun. 16-21, 2003, pp. 1-9.

Blomster, J., "Orientation Estimation Combining Vision and Gyro Measurements," KTH Electrical Engineering, Master's Degree Project, Stockholm, Sweden, Apr. 6, 2006, pp. 1-44.

Choukroun, D., "Novel Methods for Attitude Determination Using Vector Observations," Research Thesis, Senate of the Technion—Israel Institute of Technology, May 2003, pp. 1-290.

Choukroun, D., et al., "A Novel Quaternion Kalman Filter," TAE No. 930, Faculty of Aerospace Engineering, Technion—Israel Institute of Technology, Jan. 2004, pp. 1-53.

Dogancay, K., "Bias Compensation for the Bearings-Only Pseudolinear Target Track Estimator," IEEE Transactions on Signal Processing, vol. 54, No. 1, Jan. 2006, pp. 59-68.

Foxlin, E., "Inertial Head-Tracker Sensor Fusion by a Complementary Separate-Bias Kalman Filter," Proceedings of the IEEE 1996 Virtual Reality Annual International Symposium, 1996, pp. 185-194, 267.

Foxlin, E., "Pedestrian Tracking with Shoe-Mounted Inertial Sensors," Computer Graphics and Applications, IEEE, vol. 25, No. 6, 2005, pp. 38-46.

Gebre-Egziabher, D., et al., "A Gryo-Free Quaternion-Based Attitude Determination System Suitable for Implementation Using Low Cost Sensors," Position Location and Navigation Symposium, IEEE, 2000, pp. 185-192.

Gripton, A., "The Application and Future Development of a MEMS SiVS® for Commercial and Military Inertial Products," Position Location and Navigation Symposium, IEEE, 2002, pp. 28-35.

Hide, C., et al., "Multiple Model Kalman Filtering for GPS and Low-Cost INS Integration," Institute of Engineering, Surveying and Space Geodesy (IESSG), University of Nottingham; Proceedings of the International Technical Meeting of the Satellite Division of the Institute of Navigation (ION GNSS 004); Sep. 21-24; pp. 1-8; Long Beach, CA.

Hong, S., et al., "Observability of Error States in GPS/INS Integration," IEEE Transactions on Vehicular Technology, vol. 54, No. 2, Mar. 2005, pp. 731-743.

Mahony, R., et al., "Complementary Filter Design on the Special Orthogonal Group SO(3)," 44th IEEE Conference on Decision and Control, and 2005 European Control Conference, CDC-ECC '05, Dec. 2005, pp. 1477-1484.

Kraft, E., "A Quaternion-based Unscented Kalman Filter for Orientation Tracking," Proceedings of the Sixth International Conference of Information Fusion, vol. 1, 2003, pp. 47-54.

Leavitt, J., et al., "High Bandwidth Tilt Measurement Using Low-Cost Sensors, IEEE/ASME Transactions on Mechatronics," vol. 11, No. 3, Jun. 2006, pp. 320-327.

Park, S., et al., "Examples of Estimation Filters from Recent Aircraft Projects at MIT," Nov. 2004, pp. 1-15.

Park, H. W., et al., "Covariance Analysis of Strapdown INS Considering Gyrocompass Characteristics," IEEE Transactions on Aerospace and Electronic Systems, vol. 31, No. 1, Jan. 1995, pp. 320-328.

Rios, J. A., et al., "Fusion Filter Algorithm Enhancements for a MEMS GPS/IMU," Crossbow Technology, Inc., Proceedings of the 2002 national Technical Meeting of the Institute of Navigation; Jan. 28-30; pp. 1-12; San Diego, CA.

Roumeliotis, S. I., et al., "Circumventing Dynamic Modeling: Evaluation of the Error-State Kalman Filter Applied to Mobile Robot Localization," 1999 IEEE International Conference Proceedings on Robotics and Automation, vol. 2, 1999, pp. 1656-1663.

Welch, G. F., "SCAAT: Incremental Tracking with Incomplete Information," Department of Computer Science, UNC-Chapel Hill, TR96-051, Oct. 1996, pp. 1-207.

Appendices A, B and C, from U.S. Patent No. 6,069,594 to Barnes et al., pp. 1-104, May 30, 2000.

Supplemental European Search Report for Application No. EP 05 74 4089 mailed Mar. 6, 2008.

Supplemental European Search Report for Application No. EP 05 76 1047 mailed Apr. 2, 2008.

European Search Report for Application No. EP 05757855 mailed Apr. 10, 2008.

S. Strachan, et al., "Muscle Tremor as an Input Mechanism," UIST '04, XP002473042, Oct. 24-27, 2004, pp. 1-2.

International Search Report for PCT/US05/15051 mailed Feb. 19, 2008.

Written Opinion for PCT/US05/15051 mailed Feb. 19, 2008.

Office Action for Chinese Application No. 200580021163.7 mailed Jan. 25, 2008.

International Search Report for PCT/US05/42558 mailed Nov. 30, 2006.

Written Opinion for PCT/US05/42558 mailed Nov. 30, 2006.

W. T. Ang, et al., "Design and Implementation of Active Error Canceling in Hand-held Microsurgical Instrument," Proceedings of the 2001 IEEE/RSJ International Conference on Intelligent Robots and Systems, vol. 2, Oct. 2001, pp. 1106-1111.

W. T. Ang, et al., "Design of All-Accelerometer Inertial Measurement Unit for Tremor Sensing in Hand-held Microsurgical Instrument," Proceedings of the 2003 IEEE International Conference on Robotics & Automation, Sep. 2003, pp. 1781-1786.

J. Jakubowski, et al., "Increasing Effectiveness of Human Hand Tremor Separation Process by Using Higher-Order Statistics," Measurement Science Review, vol. 1, No. 1, 2001, pp. 43-46.

J. Jakubowski, et al., "Higher Order Statistics and Neural Network for Tremor Recognition," IEEE Transactions on Biomedical Engineering, vol. 49, No. 2, Feb. 2002, pp. 152-159.

J. Raethjen, et al., "Tremor Analysis in Two Normal Cohorts," Clinical Neurophysiology 115, 2004, pp. 2151-2156.

C. N. Riviere, et al., "Adaptive Canceling of Physiological Tremor for Improved Precision in Microsurgery," IEEE Transactions on Biomedical Engineering, vol. 45, No. 7, Jul. 1998, pp. 839-846.

J. Timmer, et al., "Characteristics of Hand Tremor Time Series," Biological Cybernetics, vol. 70, 1993, pp. 75-80.

J. Timmer, et al., "Cross-Spectral Analysis of Physiological Tremor and Muscle Activity: I Theory and application to Unsynchronized Electromyogram," Biological Cybernetics, vol. 78, 1998, pp. 349-357.

J. Timmer, et al., "Cross-Spectral Analysis of Physiological Tremor and Muscle Activity: II Application to Synchronized Electromyogram," Biological Cybernetics, vol. 78, 1998, pp. 359-368.

J. Timmer, "Modeling Noisy Time Series: Physiological Tremor," International Journal of Bifurcation and Chaos, vol. 8, No. 7, 1998, pp. 1505-1516.

J. Timmer, et al., "Cross-Spectral Analysis of Tremor Time Series," International Journal of Bifurcation and Chaos, vol. 10, No. 11, 2000, pp. 2595-2610.

J. Timmer, et al., "Pathological Tremors: Deterministic Chaos or Nonlinear Stochastic Oscillators?" Chaos, vol. 10, No. 1, Mar. 2000, pp. 278-288.

V. Digalakis, et al., "ML Estimation of a Stochastic Linear System with the EM Algorithm and Its Application to Speech Recognition," IEEE Transactions on Speech and Audio Processing, vol. 1, No. 4, Oct. 1993, pp. 431-442.

S. Haykin, et al., "Adaptive Tracking of Linear Time-Variant Systems by Extended RLS Algorithms," IEEE Transactions on Signal Processing, vol. 45, No. 5, May 1997, pp. 1118-1128.

K. Nishiyama, "Robust Estimation of a Single Complex Sinusoid in White Noise—H∞ Filtering Approach," IEEE Transactions on Signal Processing, vol. 47, No. 10, Oct. 1999, pp. 2853-2856.

K. Nishiyama, "A Nonlinear Filter for Estimating a Sinusoidal Signal and its Parameters in White Noise: On the Case of a Single Sinusoid," IEEE Transactions on Signal Processing, vol. 45, No. 4, Apr. 1997, pp. 970-981.

B. Widrow, et al., "Fundamental Relations Between the LMS Algorithm and the DFT," IEEE Transactions on Circuits and Systems, vol. 34, No. CAS-7, Jul. 1987, pp. 814-820.

A. H. Sayed, "A Framework for State-Space Estimation with Uncertain Models," IEEE Transactions on Automatic Control, vol. 46, No. 7, Jul. 2001, pp. 998-1013.

Website: Z. Jian, et al., "Adaptive Noise Cancellation," Rice University, ece.rice.edu/~klwang/elec434/elec434.htm, retrieved Aug. 17, 2007, pp. 1-6.

P. Navarrete, et al., "Eigenspace-based Recognition of Faces: Comparisons and a new Approach," Image Analysis and Processing, 2001, pp. 1-6.

C. Liu, et al., "Enhanced Fisher Linear Discriminant Models for Face Recognition," Proc. 14th International Conference on Pattern Recognition, Queensland, Australia, Aug. 17-20, 1998, pp. 1-5.

International Search Report for PCT/US05/15096, mailed May 15, 2006.

Written Opinion for PCT/US05/15096, mailed May 15, 2006.

International Search Report for PCT/US04/35369, mailed May 11, 2006.

Written Opinion for PCT/US04/35369, mailed May 11, 2006.

J. Geen, et al., "New iMEMS Angular-Rate-Sensing Gyroscope," Analog Dialogue, 37-03 (2003), pp. 1-4.

C. N. Riviere, et al., "Toward Active Tremor Canceling in Handheld Microsurgical Instruments," IEEE Transactions on Robotics and Automation, vol. 19, No. 5, Oct. 2003, pp. 793-800.

Website: A. H. Sayed, "UCLA Adaptive Systems Laboratory-Home Page," UCLA, http://asl.ee.ucla.edu/index.php?option=com_frontpage&Itemid=1, retrieved Aug. 17, 2007, p. 1.

Supplemental European Search Report for Application No. EP 04 79 6360 mailed Apr. 2, 2008.

B. F. La Scala, et al., "Design of an Extended Kalman Filter Frequency Tracker," IEEE Transactions on Signal Processing, vol. 44, No. 3, Mar. 1996, pp. 739-742.

Website: J. Timmer, "Data Analysis and Modeling of Dynamic Processes in the Life Sciences," Freiburg Center for Data Analysis and Modeling, webber.physik.uni-freiburg.de/~jeti/, retrieved Aug. 17, 2007, pp. 1-2.

Website: "Freiburg Center for Data Analysis and Modeling—Publications," fdm.uni-freiburg.de/cms/puplications/publications/, retrieved Aug. 17, 2007, pp. 1-11.

Website: C. Riviere, Robotics Institute, ri.cmu.edu/people/riviere_cameron.html, retrieved Aug. 17, 2007, pp. 1-4.

Website: A. Beuter, Publications, University of Quebec at Montreal, er.uqam.ca/nobel/r11040/publicat.htm, retrieved Aug. 17, 2007, pp. 1-7.

Website: R. Murray-Smith, Hamilton Institute, dcs.gla.ac.uk/~rod/, retrieved Aug. 17, 2007, pp. 1-5.

* cited by examiner

REAL-TIME DYNAMIC TRACKING OF BIAS

RELATED APPLICATION

This application is a continuation of U.S. patent application Ser. No. 12/163,229, filed on Jun. 27, 2008, now U.S. Pat. No. 7,860,676, which is related to, and claims priority from, expired U.S. Provisional Patent Application Ser. No. 60/937,596, filed on Jun. 28, 2007, entitled "Real-Time Dynamic Tracking of Time-Varying Bias in 3D Pointing Devices", the disclosures of which are incorporated here by reference.

BACKGROUND

The present invention describes bias tracking techniques, systems, software and devices, which can be used in 3D pointing devices, as well as in other types of devices.

Technologies associated with the communication of information have evolved rapidly over the last several decades. Television, cellular telephony, the Internet and optical communication techniques (to name just a few things) combine to inundate consumers with available information and entertainment options. Taking television as an example, the last three decades have seen the introduction of cable television service, satellite television service, pay-per-view movies and video-on-demand. Whereas television viewers of the 1960s could typically receive perhaps four or five over-the-air TV channels on their television sets, today's TV watchers have the opportunity to select from hundreds, thousands, and potentially millions of channels of shows and information. Video-on-demand technology, currently used primarily in hotels and the like, provides the potential for in-home entertainment selection from among thousands of movie titles.

The technological ability to provide so much information and content to end users provides both opportunities and challenges to system designers and service providers. One challenge is that while end users typically prefer having more choices rather than fewer, this preference is counterweighted by their desire that the selection process be both fast and simple. Unfortunately, the development of the systems and interfaces by which end users access media items has resulted in selection processes which are neither fast nor simple. Consider again the example of television programs. When television was in its infancy, determining which program to watch was a relatively simple process primarily due to the small number of choices. One would consult a printed guide which was formatted, for example, as series of columns and rows which showed the correspondence between (1) nearby television channels, (2) programs being transmitted on those channels and (3) date and time. The television was tuned to the desired channel by adjusting a tuner knob and the viewer watched the selected program. Later, remote control devices were introduced that permitted viewers to tune the television from a distance. This addition to the user-television interface created the phenomenon known as "channel surfing" whereby a viewer could rapidly view short segments being broadcast on a number of channels to quickly learn what programs were available at any given time.

Despite the fact that the number of channels and amount of viewable content has dramatically increased, the generally available user interface, control device options and frameworks for televisions has not changed much over the last 30 years. Printed guides are still the most prevalent mechanism for conveying programming information. The multiple button remote control with up and down arrows is still the most prevalent channel/content selection mechanism. The reaction of those who design and implement the TV user interface to the increase in available media content has been a straightforward extension of the existing selection procedures and interface objects. Thus, the number of rows in the printed guides has been increased to accommodate more channels. The number of buttons on the remote control devices has been increased to support additional functionality and content handling, e.g., as shown in FIG. 1. However, this approach has significantly increased both the time required for a viewer to review the available information and the complexity of actions required to implement a selection. Arguably, the cumbersome nature of the existing interface has hampered commercial implementation of some services, e.g., video-on-demand, since consumers are resistant to new services that will add complexity to an interface that they view as already too slow and complex.

In addition to increases in bandwidth and content, the user interface bottleneck problem is being exacerbated by the aggregation of technologies. Consumers are reacting positively to having the option of buying integrated systems rather than a number of segregable components. An example of this trend is the combination television/VCR/DVD in which three previously independent components are frequently sold today as an integrated unit. This trend is likely to continue, potentially with an end result that most if not all of the communication devices currently found in the household will be packaged together as an integrated unit, e.g., a television/VCR/DVD/internet access/radio/stereo unit. Even those who continue to buy separate components will likely desire seamless control of, and interworking between, the separate components. With this increased aggregation comes the potential for more complexity in the user interface. For example, when so-called "universal" remote units were introduced, e.g., to combine the functionality of TV remote units and VCR remote units, the number of buttons on these universal remote units was typically more than the number of buttons on either the TV remote unit or VCR remote unit individually. This added number of buttons and functionality makes it very difficult to control anything but the simplest aspects of a TV or VCR without hunting for exactly the right button on the remote. Many times, these universal remotes do not provide enough buttons to access many levels of control or features unique to certain TVs. In these cases, the original device remote unit is still needed, and the original hassle of handling multiple remotes remains due to user interface issues arising from the complexity of aggregation. Some remote units have addressed this problem by adding "soft" buttons that can be programmed with the expert commands. These soft buttons sometimes have accompanying LCD displays to indicate their action. These too have the flaw that they are difficult to use without looking away from the TV to the remote control. Yet another flaw in these remote units is the use of modes in an attempt to reduce the number of buttons. In these "moded" universal remote units, a special button exists to select whether the remote should communicate with the TV, DVD player, cable set-top box, VCR, etc. This causes many usability issues including sending commands to the wrong device, forcing the user to look at the remote to make sure that it is in the right mode, and it does not provide any simplification to the integration of multiple devices. The most advanced of these universal remote units provide some integration by allowing the user to program sequences of commands to multiple devices into the remote. This is such a difficult task that many users hire professional installers to program their universal remote units.

Some attempts have also been made to modernize the screen interface between end users and media systems. However, these attempts typically suffer from, among other drawbacks, an inability to easily scale between large collections of media items and small collections of media items. For example, interfaces which rely on lists of items may work well for small collections of media items, but are tedious to browse for large collections of media items. Interfaces which rely on hierarchical navigation (e.g., tree structures) may be speedier to traverse than list interfaces for large collections of media items, but are not readily adaptable to small collections of media items. Additionally, users tend to lose interest in selection processes wherein the user has to move through three or more layers in a tree structure. For all of these cases, current remote units make this selection processor even more tedious by forcing the user to repeatedly depress the up and down buttons to navigate the list or hierarchies. When selection skipping controls are available such as page up and page down, the user usually has to look at the remote to find these special buttons or be trained to know that they even exist. Accordingly, organizing frameworks, techniques and systems which simplify the control and screen interface between users and media systems as well as accelerate the selection process, while at the same time permitting service providers to take advantage of the increases in available bandwidth to end user equipment by facilitating the supply of a large number of media items and new services to the user have been proposed in abandoned U.S. patent application Ser. No. 10/768,432, filed on Jan. 30, 2004, entitled "A Control Framework with a Zoomable Graphical User Interface for Organizing, Selecting and Launching Media Items", the disclosure of which is incorporated here by reference.

Of particular interest for this specification are the remote devices usable to interact with such frameworks, as well as other applications and systems. As mentioned in the above-incorporated application, various different types of remote devices can be used with such frameworks including, for example, trackballs, "mouse"-type pointing devices, light pens, etc. However, another category of remote devices which can be used with such frameworks (and other applications) is 3D pointing devices. The phrase "3D pointing" is used in this specification to refer to the ability of an input device to move in three (or more) dimensions in the air in front of, e.g., a display screen, and the corresponding ability of the user interface to translate those motions directly into user interface commands, e.g., movement of a cursor on the display screen. The transfer of data between the 3D pointing device may be performed wirelessly or via a wire connecting the 3D pointing device to another device. Thus "3D pointing" differs from, e.g., conventional computer mouse pointing techniques which use a surface, e.g., a desk surface or mousepad, as a proxy surface from which relative movement of the mouse is translated into cursor movement on the computer display screen. An example of a 3D pointing device can be found in U.S. Pat. No. 7,118,518 to Matthew G. Liberty (hereafter referred to as the '518 patent), the disclosure of which is incorporated here by reference.

The '518 patent describes 3D pointing devices which include, for example, one or two rotational sensors and an accelerometer. The rotational sensor(s) are used, as described in more detail below, to detect an angular rate at which the 3D pointing device is being rotated by a user. However, the output of the rotational sensor(s) does not perfectly represent the angular rate at which the 3D pointing device is being rotated due to, for example, bias (also sometimes referred to as "offset") in the sensor(s)' outputs. For example, when the 3D pointing device is motionless, the rotational sensor(s) will typically have a non-zero output due to their bias. If, for example, the 3D pointing device is used as an input to a user interface, e.g., to move a cursor, this will have the undesirable effect of cursor drifting across the screen when the user intends for the cursor to remain stationary. Thus, in order to provide a 3D pointing device which accurately reflects the user's intended movement, estimating and removing bias from sensor output is highly desirable. Moreover other devices, in addition to 3D pointing devices, may benefit from being able to estimate and compensate for the bias of inertial sensors. Making this process more challenging is the fact that the bias is different from sensor to sensor and, even for individual sensors, is time-varying, e.g., due to changes in temperature.

Accordingly, there is still room for improvement in the area of bias estimation and handheld device design, generally, and 3D pointer design, more specifically.

SUMMARY

According to one exemplary embodiment, a 3D pointing device includes at least one inertial sensor for detecting rotation of said 3D pointing device about at least one axis and generating a first output associated therewith, an accelerometer for detecting acceleration of the 3D pointing device and generating a second output associated therewith, and a processor for receiving the first and second outputs, determining a bias value associated with the first output using at least a first bias estimation technique and a second bias estimation technique and compensating the first output using the bias value.

According to another exemplary embodiment, a computer-readable medium contains instructions which, when executed on a processor, perform the step of estimating a bias value associated with an inertial sensor using at least a first bias estimating technique to generate a first bias estimate and a second bias estimating technique to generate a second bias estimate.

According to another exemplary embodiment, a method for estimating bias associated with an inertial sensor includes estimating the bias associated with the inertial sensor using at least a first bias estimating technique to generate a first bias estimate and a second bias estimating technique to generate a second bias estimate.

According to still another exemplary embodiment, a processor includes a first function for estimating bias associated with an inertial sensor using a first bias estimation technique to generate first bias estimates, and a second function for estimating the bias associated with the inertial sensor using a second bias estimation technique to generate second bias estimates.

According to yet another exemplary embodiment, a pointing device includes at least one sensor for determining rotation of the pointing device about a first axis and generating a first output associated therewith and for determining rotation of the pointing device about a second axis and generating a second output associated therewith, an accelerometer for determining an acceleration of the pointing device and outputting an acceleration output associated therewith, a temperature sensor for detecting a temperature of the 3D pointing device and outputting a temperature output associated therewith, and a processing unit for determining a bias estimate associated with the at least one rotational sensor using: (a) a first bias estimate technique for generating first bias estimate data based upon determining whether the pointing device is stationary using the first, second and third outputs, (b) a second bias estimate technique for generating second bias estimate data based upon detection of a pitch of the pointing device using the first, second and third outputs, (c) a third bias estimate technique for generating third bias estimate data based upon slew-rate filtering using the first and second outputs, and (d) a fourth bias estimate technique for generating fourth bias estimate data based upon the temperature output and the first and second outputs.

BRIEF DESCRIPTION OF THE DRAWINGS

The accompanying drawings illustrate exemplary embodiments, wherein.

DETAILED DESCRIPTION

Figure 1:
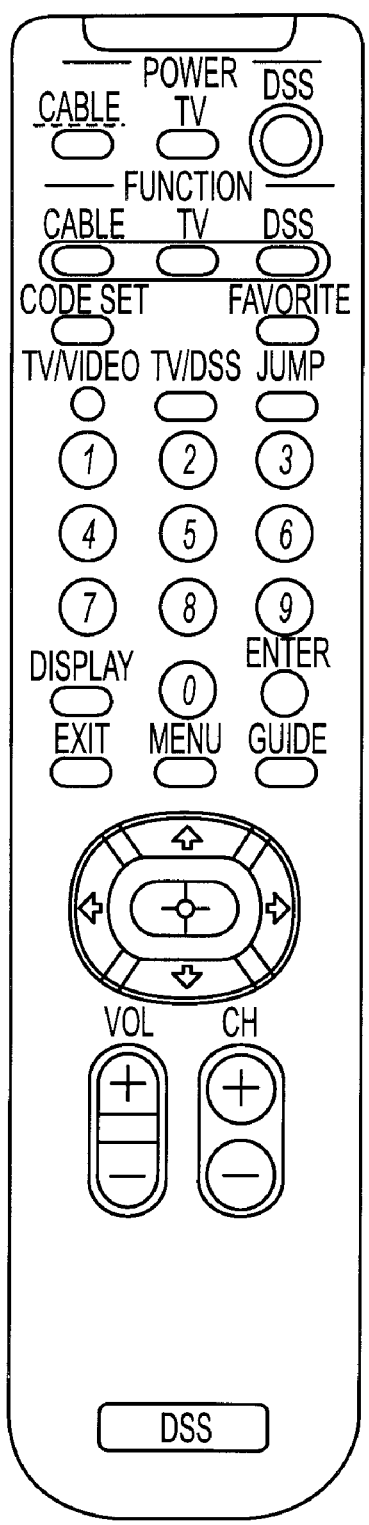
FIG. 1 depicts a conventional remote control unit for an entertainment system.

The following detailed description of the invention refers to the accompanying drawings. The same reference numbers in different drawings identify the same or similar elements. Also, the following detailed description does not limit the invention. Instead, the scope of the invention is defined by the appended claims.

In order to provide some context for this discussion, an exemplary aggregated media system 200 in which the present invention can be implemented will first be described with respect to FIG. 2. Those skilled in the art will appreciate, however, that the present invention is not restricted to implementation in this type of media system and that more or fewer components can be included therein. Therein, an input/output (I/O) bus 210 connects the system components in the media system 200 together. The I/O bus 210 represents any of a number of different of mechanisms and techniques for routing signals between the media system components. For example, the I/O bus 210 may include an appropriate number of independent audio "patch" cables that route audio signals, coaxial cables that route video signals, two-wire serial lines or infrared or radio frequency transceivers that route control signals, optical fiber or any other routing mechanisms that route other types of signals.

In this exemplary embodiment, the media system 200 includes a television/monitor 212, a video cassette recorder (VCR) 214, digital video disk (DVD) recorder/playback device 216, audio/video tuner 218 and compact disk player 220 coupled to the I/O bus 210. The VCR 214, DVD 216 and compact disk player 220 may be single disk or single cassette devices, or alternatively may be multiple disk or multiple cassette devices. They may be independent units or integrated together. In addition, the media system 200 includes a microphone/speaker system 222, video camera 224 and a wireless I/O control device 226. According to exemplary embodiments of the present invention, the wireless I/O control device 226 is a 3D pointing device according to one of the exemplary embodiments described below. The wireless I/O control device 226 can communicate with the entertainment system 200 using, e.g., an IR or RF transmitter or transceiver. Alternatively, the I/O control device can be connected to the entertainment system 200 via a wire.

The entertainment system 200 also includes a system controller 228. According to one exemplary embodiment of the present invention, the system controller 228 operates to store and display entertainment system data available from a plurality of entertainment system data sources and to control a wide variety of features associated with each of the system components. As shown in FIG. 2, system controller 228 is coupled, either directly or indirectly, to each of the system components, as necessary, through I/O bus 210. In one exemplary embodiment, in addition to or in place of I/O bus 210, system controller 228 is configured with a wireless communication transmitter (or transceiver), which is capable of communicating with the system components via IR signals or RF signals. Regardless of the control medium, the system controller 228 is configured to control the media components of the media system 200 via a graphical user interface described below.

Figure 2:
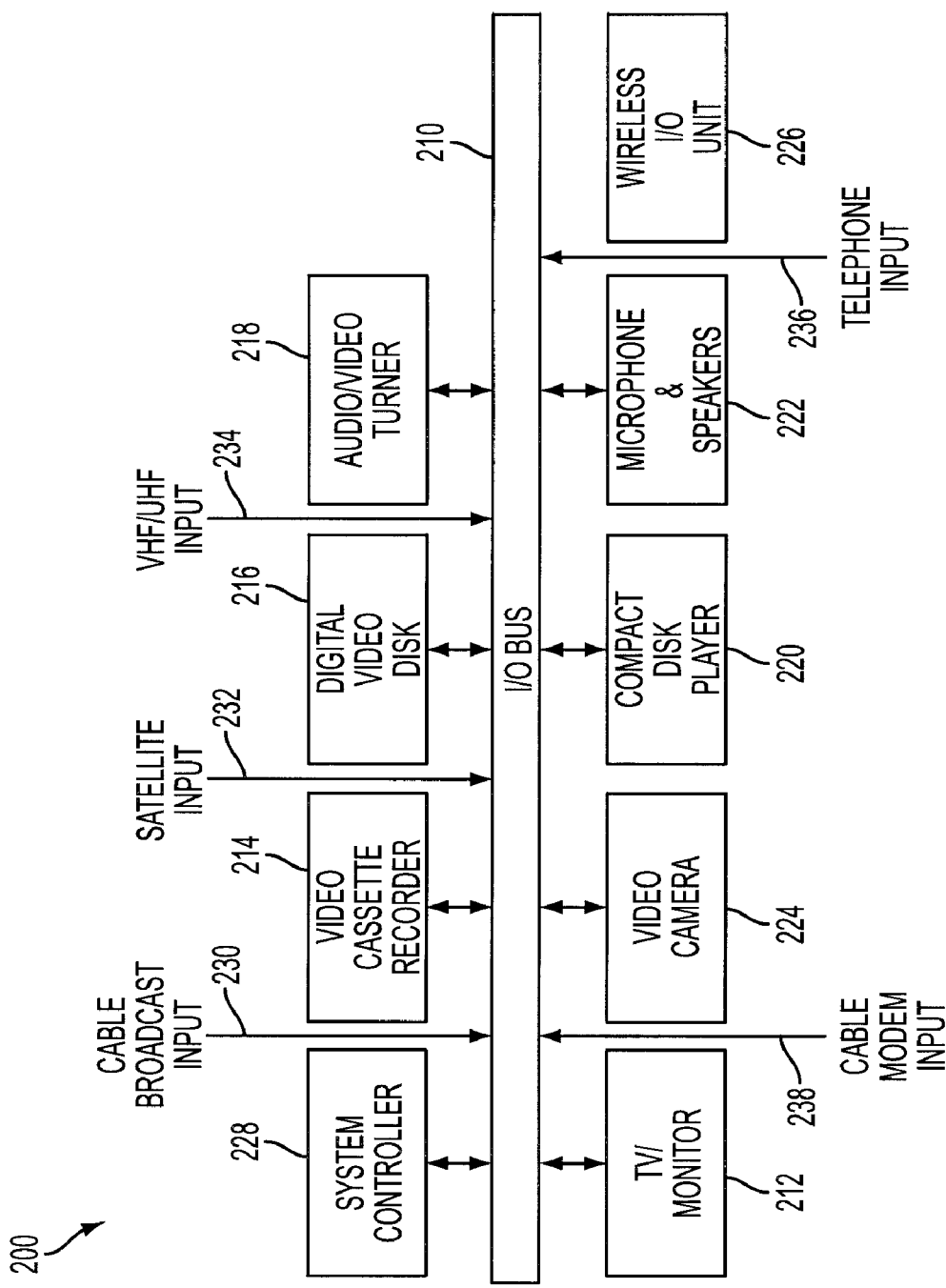
FIG. 2 depicts an exemplary media system in which exemplary embodiments can be implemented.

As further illustrated in FIG. 2, media system 200 may be configured to receive media items from various media sources and service providers. In this exemplary embodiment, media system 200 receives media input from and, optionally, sends information to, any or all of the following sources: cable broadcast 230, satellite broadcast 232 (e.g., via a satellite dish), very high frequency (VHF) or ultra high frequency (UHF) radio frequency communication of the broadcast television networks 234 (e.g., via an aerial antenna), telephone network 236 and cable modem 238 (or another source of Internet content). Those skilled in the art will appreciate that the media components and media sources illustrated and described with respect to FIG. 2 are purely exemplary and that media system 200 may include more or fewer of both. For example, other types of inputs to the system include AM/FM radio and satellite radio.

More details regarding this exemplary entertainment system and frameworks associated therewith can be found in the above-incorporated by reference abandoned U.S. Patent Application "A Control Framework with a Zoomable Graphical User Interface for Organizing, Selecting and Launching Media Items". Alternatively, remote devices in accordance with the present invention can be used in conjunction with other systems, for example computer systems including, e.g., a display, a processor and a memory system or with various other systems and applications.

Figure 3:
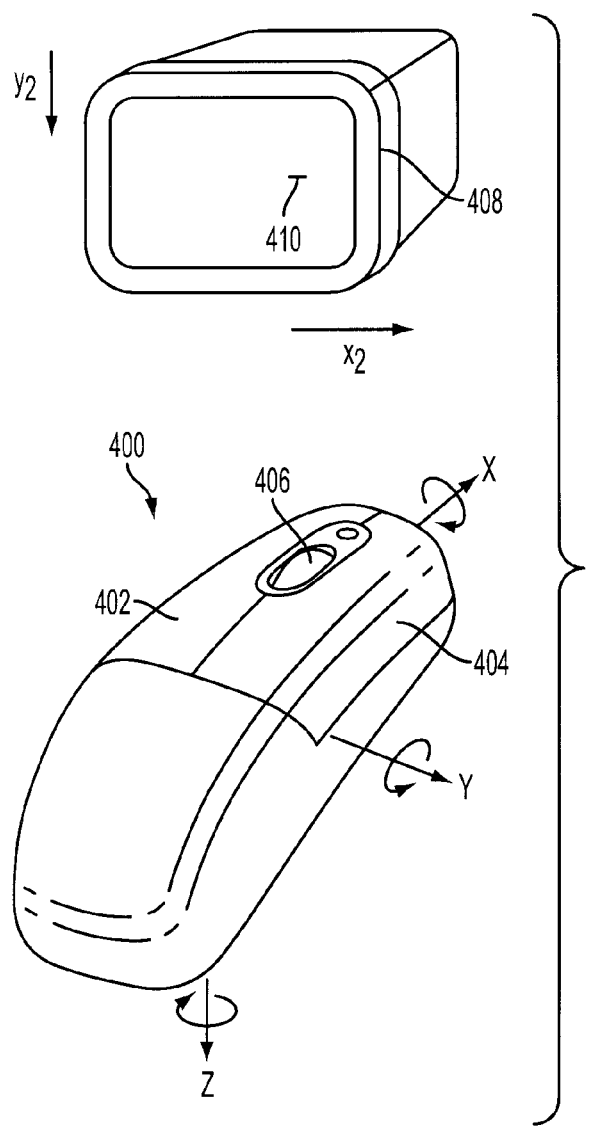
FIG. 3 shows a 3D pointing device according to an exemplary embodiment of the present invention.

As mentioned in the Background section, remote devices which operate as 3D pointers are of particular interest for the present specification. Such devices enable the translation of movement, e.g., gestures, into commands to a user interface. An exemplary 3D pointing device 400 is depicted in FIG. 3. Therein, user movement of the 3D pointing can be defined, for example, in terms of a combination of x-axis attitude (roll), y-axis elevation (pitch) and/or z-axis heading (yaw) motion of the 3D pointing device 400. In addition, some exemplary embodiments of the present invention can also measure linear movement of the 3D pointing device 400 along the x, y, and z axes to generate cursor movement or other user interface commands. In the exemplary embodiment of FIG. 3, the 3D pointing device 400 includes two buttons 402 and 404 as well as a scroll wheel 406, although other exemplary embodiments will include other physical configurations. According to exemplary embodiments of the present invention, it is anticipated that 3D pointing devices 400 will be held by a user in front of a display 408 and that motion of the 3D pointing device 400 will be translated by the 3D pointing device into output which is usable to interact with the information displayed on display 408, e.g., to move the cursor 410 on the display 408. For example, rotation of the 3D pointing device 400 about the y-axis can be sensed by the 3D pointing device 400 and translated into an output usable by the system to move cursor 410 along the $y_2$ axis of the display 408. Likewise, rotation of the 3D pointing device 408 about the z-axis can be sensed by the 3D pointing device 400 and translated into an output usable by the system to move cursor 410 along the $x_2$ axis of the display 408. It will be appreciated that the output of 3D pointing device 400 can be used to interact with the display 408 in a number of ways other than (or in addition to) cursor movement, for example it can control cursor fading, volume or media transport (play, pause, fast-forward and rewind). Input commands may include operations in addition to cursor movement, for example, a zoom in or zoom out on a particular region of a display. A cursor may or may not be visible. Similarly, rotation of the 3D pointing device 400 sensed about the x-axis of 3D pointing device 400 can be used in addition to, or as an alternative to, y-axis and/or z-axis rotation to provide input to a user interface.

Figure 4:
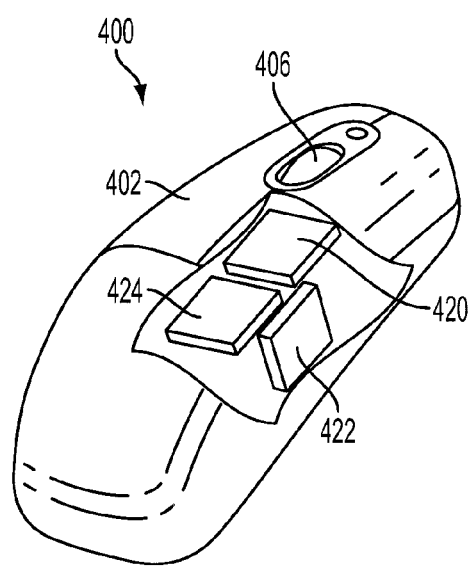
FIG. 4 illustrates a cutaway view of the 3D pointing device in FIG. 4 including two rotational sensors and one accelerometer.

According to one purely illustrative exemplary embodiment of the present invention, two rotational sensors 420 and 422 and one accelerometer 424 can be employed as sensors in 3D pointing device 400 as shown in FIG. 4. Although this exemplary embodiment employs inertial sensors it will be appreciated that the present invention is not so limited and examples of other types of sensors which can be used in conjunction with other exemplary embodiments are provided below. The rotational sensors 420 and 422 can, for example, be implemented using ADXRS150 or ADXRS401 sensors made by Analog Devices. It will be appreciated by those skilled in the art that other types of rotational sensors can be employed as rotational sensors 420 and 422 and that the ADXRS150 and ADXRS401 are purely used as an illustrative example. Unlike traditional gyroscopes, these rotational sensors use MEMS technology to provide a resonating mass which is attached to a frame so that it can resonate only along one direction. The resonating mass is displaced when the body to which the sensor is affixed is rotated around the sensor's sensing axis. This displacement can be measured using the Coriolis acceleration effect to determine an angular velocity associated with rotation along the sensing axis. If the rotational sensors 420 and 422 have a single sensing axis (as for example the ADXRS150s), then they can be mounted in the 3D pointing device 400 such that their sensing axes are aligned with the rotations to be measured. For this exemplary embodiment of the present invention, this means that rotational sensor 422 is mounted such that its sensing axis is parallel to the y-axis and that rotational sensor 420 is mounted such that its sensing axis is parallel to the z-axis as shown in FIG. 4. It will be appreciated that different sensor packages may be available which could lead to other exemplary implementations. For example, the two 1-D rotational sensors 420 and 422 could be replaced by a single, 2D rotational sensor package which provides outputs of rotational motion along, e.g., the y and z axes. One exemplary 2-D rotational sensor is the Invensense IDG-300, although it will be appreciated that other sensors/sensor packages may also be used. The rotational sensors 420, 422 can be 1-D, 2-D or 3-D sensors. The accelerometer 424 can, for example, be a 3-axis linear accelerometer, although a 2-axis linear accelerometer could be used by assuming that the device is measuring gravity and mathematically computing the remaining $3^{rd}$ value. Additionally, the accelerometer(s) and rotational sensor(s) could be packaged together into a single sensor package. Other variations of sensors and sensor packages may also be used in conjunction with these exemplary embodiments.

Figure 5:
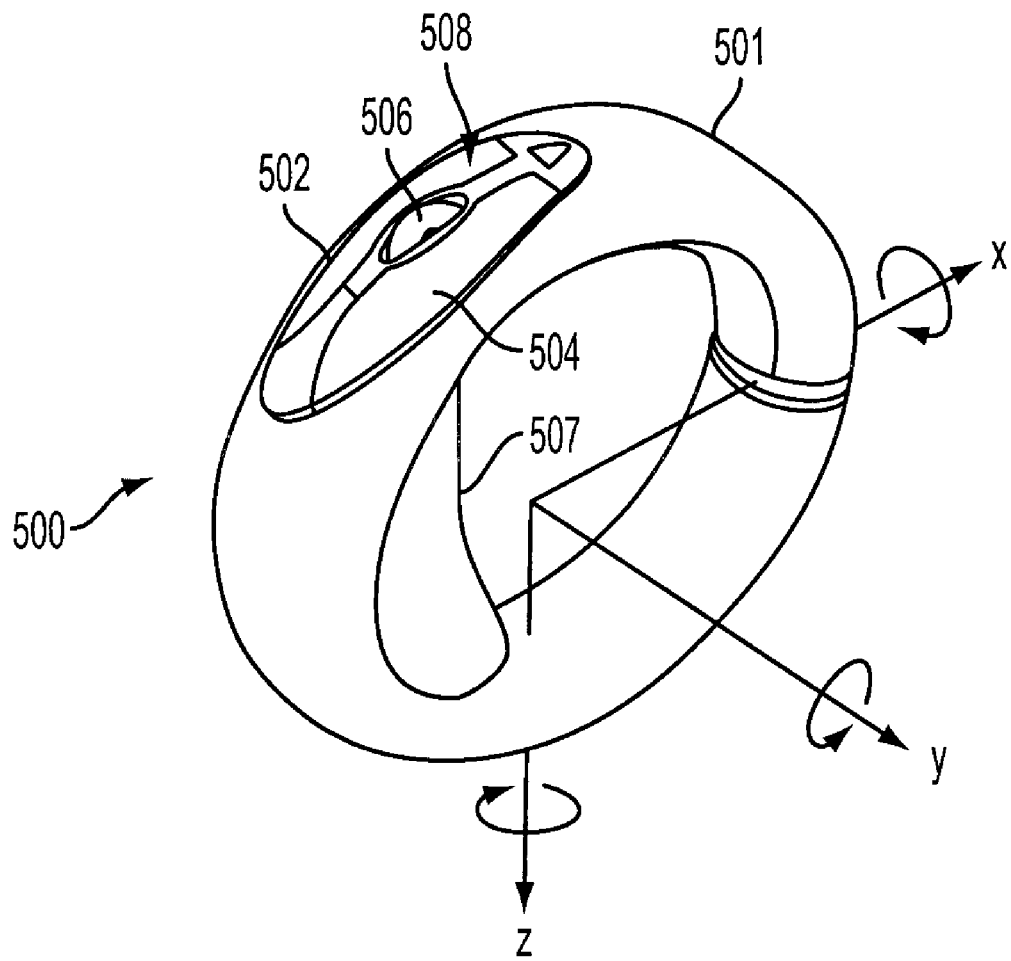
FIG. 5 shows a 3D pointing device according to another exemplary embodiment.
Figure 6:
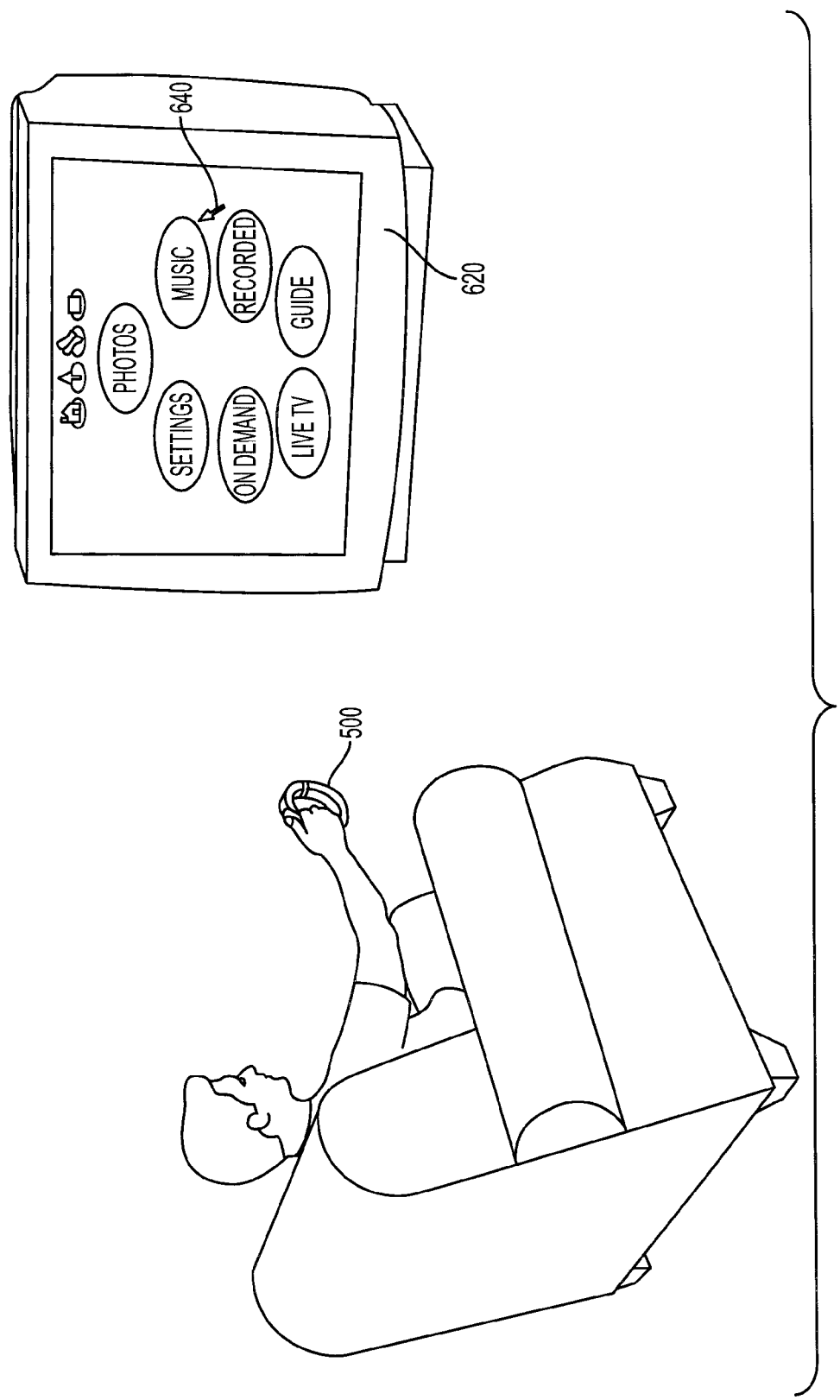
FIG. 6 depicts the 3D pointing device of FIG. 5 being used as part of a "10 foot" interface according to an exemplary embodiment.

The exemplary embodiments are not limited to the industrial design illustrated in FIGS. 3 and 4, but can instead be deployed in any industrial form factor, another example of which is illustrated as FIG. 5. In the exemplary embodiment of FIG. 5, the 3D pointing device 500 includes a ring-shaped housing 501, two buttons 502 and 504 as well as a scroll wheel 506 and grip 507, although other exemplary embodiments may include other physical configurations. The region 508 which includes the two buttons 502 and 504 and scroll wheel 506 is referred to herein as the "control area" 508, which is disposed on an outer portion of the ring-shaped housing 501. More details regarding this exemplary embodiment can be found in abandoned U.S. patent application Ser. No. 11/480,662, entitled "3D Pointing Devices", filed on Jul. 3, 2006, the disclosure of which is incorporated here by reference. Such devices have numerous applications including, for example, usage in the so-called "10 foot" interface between a sofa and a television in the typical living room as shown in FIG. 6. Therein, as the 3D pointing device 500 moves between different positions, that movement is detected by one or more sensors within 3D pointing device 200 and transmitted to the television 620 (or associated system component, e.g., a set-top box (not shown)). Movement of the 3D pointing device 500 can, for example, be translated into movement of a cursor 640 displayed on the television 620 and which is used to interact with a user interface. Details of an exemplary user interface with which the user can interact via 3D pointing device 500 can be found, for example, in the above-incorporated abandoned U.S. patent application Ser. No. 10/768,432 as well as abandoned U.S. patent application Ser. No. 11/437,215, entitled "Global Navigation Objects in User Interfaces", filed on May 19, 2006, the disclosure of which is incorporated here by reference.

One challenge faced in implementing exemplary 3D pointing devices 400 in accordance with these exemplary embodiments is to employ components, e.g., rotational sensors 502 and 504, which are not too costly, while at the same time providing a high degree of correlation between movement of the 3D pointing device 400, a user's expectation regarding how the user interface will react to that particular movement of the 3D pointing device and actual user interface performance in response to that movement. For example, if the 3D pointing device 400 is not moving, the user will likely expect that the cursor ought not to be drifting across the screen. Likewise, if the user rotates the 3D pointing device 400 purely around the y-axis, she or he would likely not expect to see the resulting cursor movement on display 408 contain any significant x-axis component. To achieve these, and other, aspects of exemplary embodiments of the present invention, various measurements and calculations are performed, e.g., by the handheld device 400, which are used to adjust the outputs of one or more of the sensors 420, 422 and 424 and/or as part of the input used by a processor to determine an appropriate output for the user interface based on the outputs of the sensors 420, 422 and 424. These measurements and calculations are used to compensate for factors which fall broadly into two categories: (1) factors which are intrinsic to the 3D pointing device 400, e.g., errors associated with the particular sensors 420, 422 and 424 used in the device 400 or the way in which the sensors are mounted in the device 400 and (2) factors which are not intrinsic to the 3D pointing device 400, but are instead associated with the manner in which a user is using the 3D pointing device 400, e.g., linear acceleration, tilt and tremor. Some exemplary techniques for handling these effects are described in the above-incorporated by reference '518 patent. However the following exemplary embodiments provide additional techniques for handling the bias or offset error contributions to sensed motion which were described in the Background section above.

Time-Varying Bias Tracking and Compensation

Figure 7:
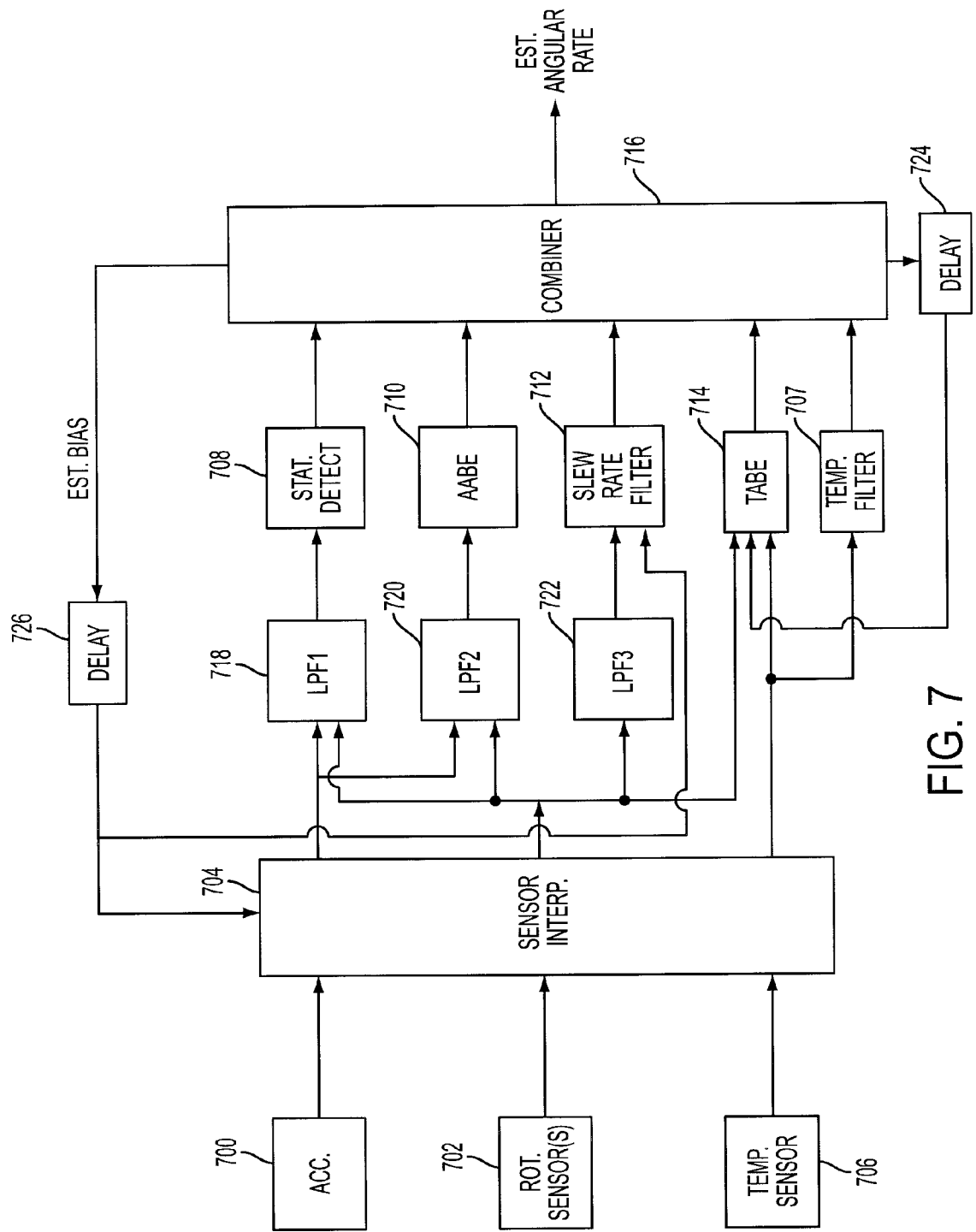
FIG. 7 illustrates bias estimation according to an exemplary embodiment.

Referring now to FIG. 7, the sensors 700 and 702 within the 3D pointing device provide a relatively noisy and distorted output that represents, in this exemplary embodiment, both angular rate and linear acceleration for the device. It will be appreciated that the present invention is not limited to sensor combinations including two rotational sensors and an accelerometer, but can include other types of, e.g., inertial, sensors as described below. An overview of the time-varying bias tracking and compensation scheme shown in FIG. 7 will first be provided, followed by a more detailed discussion of the functional blocks illustrated therein. The (optional) sensor interpretation block 704 uses pre-calculated bias values to improve the distorted sensor output while also converting the sensor output into standardized units. If sensor interpretation block 704 is removed, or instead disposed further downstream in the processing chain, raw sensor outputs can alternatively be processed to estimate and remove bias.

The temperature sensor 706's information is processed by the temperature filter 707 to remove noise from the temperature signal. In this exemplary embodiment, four different techniques are used to estimate the bias associated with the output of the rotational sensors 702 and the resulting bias estimates are combined or selected to form a composite value. More specifically, as seen in the exemplary embodiment of FIG. 7, the interpreted accelerometer and angular rate signals are processed by a stationary detection component 708, an accelerometer-assisted bias estimation (AABE) function 710, a slew-rate filter 712 and a temperature-assisted bias estimator (TABE) 714. The output from each of the four blocks 708-714 is provided to an estimate combiner 716 which produces a single estimate for the angular rate bias which estimate is updated as the 3D pointing device operates. Although this exemplary embodiment provides for a combination of four different bias estimates, it will be appreciated that other exemplary implementations could combine any subset of the four bias estimates to generate a composite bias estimate. A table illustrating the various permutations is provided below. However in this exemplary implementation, each of the four different techniques has certain strengths and weaknesses such that using all four in a blended approach provides a good estimate of the time-varying bias of the sensors.

In the exemplary embodiment of FIG. 7, the sensors 700 and 702 provide uncalibrated output data that corresponds to movement of the 3D pointing device, i.e., linear acceleration and angular rate, and temperature of the 3D pointing device. The output values may be corrupted by noise, bias, cross-coupling and other errors. Accordingly, the (optional) sensor interpretation block 704 converts the uncalibrated data to standardized SI units (e.g., m/sec² for the accelerometer data and rads/sec for the rotational sensor(s)) using pre-calculated values. Furthermore, the angular rate data output from the rotational sensor(s) 702 is decoupled from the calibrated temperature data using pre-calibrated values. A calibrated error residual will, however, remain since the sensor output values are environmentally dependent. More information regarding exemplary implementations of techniques which can be used in the sensor interpretation block 704 can be found in the above-incorporated by reference '518 patent.

The measured or detected temperature values which are output from the temperature sensor 706, and which reflect a temperature at which the accelerometer 700 and/or rotational sensors 702 are currently operating, contain significant noise that would negatively affect downstream processing. To improve performance of bias estimation according to these exemplary embodiments, a temperature filter 707 is provided which improves the temperature estimate by removing noise with minimal latency. According to one purely illustrative exemplary embodiment, the noise in the temperature estimates can be pre-calculated statistically and then filtered or reduced by the temperature filter 707 using single exponential smoothing (SES) or double exponential smoothing (DES).

$$S(t_n) = \alpha(t) \cdot y(t_n) + (1 - \alpha(t)) \cdot S(t_n) \quad SES \text{ model}$$

or $$\begin{cases} S(t_n) = a(t) \cdot y(t_n) + (1 - \alpha(t)) \cdot (S(t_n) + b(t_n)) \\ b(t_n) = \gamma \cdot (S(t_n) - S(t_{n-1})) + (1 - \gamma) \cdot b(t_{n-1}) \end{cases} DES \text{ model}$$

The smoothing timescale α(t) used in SES or DES can also be adaptively calculated based on the real-time (on-line) temperature change rate as long as the temperature changes by a certain predetermined threshold. This predetermined threshold can be proportional to the bias change rate bounded by the worst temperature-induced bias change. The associated error variance of the output can also be dynamically calculated in real-time by the temperature filter 707 such that block 707 outputs both a filtered temperature value and its associated error variance to the combiner 716.

Stationary detection block 708 determines when the 3D pointing device is not moving. According to this exemplary embodiment, the stationary detection block 708 analyzes the peak-to-peak values over a block of data from both the accelerometer 700 and angular rate sensor(s) 702. When the peak-to-peak value is less than a predetermined threshold, the device is determined to be stationary. The threshold allows the device to differentiate between the quasi-stationary state where a user is holding the 3D pointing device in his or her hand (but trying not to move it) and the true stationary state when it is not being held by a user and is, e.g., resting on a desk or table. When the device is held, human tremor moves the 3D pointing device slightly and forces the detected peak-to-peak value above the threshold. An optional low-pass filter 718 can be provided upstream of the stationary detection function 708 to minimize the 50/60 Hz electric power-line interference while preserving the movement data associated with human tremor. More information relating to exemplary stationary detection techniques can be found in the incorporated by reference '518 patent. When the device is stationary, any non-zero outputs of the sensors are accurate estimates of the bias associated with the sensors. However, this technique cannot be used when the device is moving.

Accordingly, a second bias estimate is generated by an accelerometer-assisted bias estimator (AABE) 710 according to this exemplary embodiment. The AABE 710 uses Earth's gravity to determine the angular rate bias in up to two of the three angular directions. An (optional) finite impulse response (FIR) low-pass filter 720 is provided upstream of AABE 710 to eliminate sensor output data associated with hand tremor sensed by the sensors 700 and 702. The same filter 720 can be used on both the accelerometer data and angular rate data to keep the sensor data synchronized. In order to better understand the technique employed by the AABE 710 to estimate bias error, consider first that the 3D pointing device's body coordinate system can be defined as shown above in FIGS. 3 and 5. However a user of the device's coordinate system xyz is defined in terms of the Earth's local tangent plane and north. That is, from the user's perspective the positive x-axis points north in the tangent plane, the positive y-axis points east, and the positive z-axis is directed geocentrically (downward).

According to Euler's Theorem, any two independent, ortho-normal coordinate frames can be related by a sequence of rotations (not more than three) about coordinate axes, where no two successive rotations may be about the same axis. A rotation sequence can, therefore, be used to transform movement data from the body frame of reference (in which the sensors inherently detect movement) to the user's frame of reference. This provides, among other things and purely as an example, the capability to use the sensed movement data to more faithfully reproduce the user's intended movement of, e.g., a cursor which is controlled based on movement of the 3D pointing device.

Figure 8A:
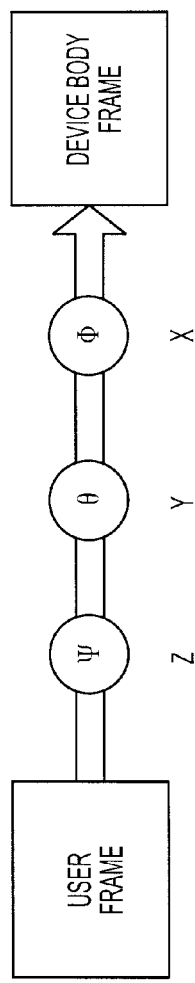
FIG. 8(a) is a diagram illustrating an exemplary rotation sequence according to an exemplary embodiment.

A conceptual illustration of an exemplary rotation sequence for performing this transformation is shown as FIG. 8(a). For this sequence, the first rotation is about the z-axis through an angle $\psi$, the second rotation is about the (new) y-axis through an angle $\theta$, and the third rotation is taken about the (newest) x-axis through an angle $\phi$. More information relating to transforming data from a body frame of reference to a user's frame of reference may also be found in the '518 patent. However, returning to the usage of this information to estimate bias by AABE 710, the increment of the elevation angle $\theta$ measured from the angular rate sensor 702 and accelerometer 700 should be identical if their outputs were error free. Thus an estimate of the bias error introduced into the measurement data output from the sensors can be determined by calculating a difference between a change of elevation angle $\theta$ determined using the data output from the rotational sensors 702 and a change of elevation angle $\theta$ determined using data output from the accelerometer 700.

Consider first that the existing biases in the measurements of the rotational sensor(s) 702 can be represented as follows:

$$\begin{cases} {}^b\hat{\omega}_z = {}^b\omega_z + Bias_{b_{\omega_z}} + \varepsilon_{b_{\omega_z}} \\ {}^b\hat{\omega}_y = {}^b\omega_y + Bias_{b_{\omega_y}} + \varepsilon_{b_{\omega_y}} \end{cases}$$

where ${}^b\hat{\omega}_z$ is the measurement of the z component of the angular velocity vector in the body frame of reference generated by a rotational sensor 702, ${}^b\hat{\omega}_y$ is the measurement of the y component of the angular velocity vector in the body frame of reference generated by a rotational sensory 702, ${}^b\omega_z$ and ${}^b\omega_y$ are the truth of z and y components of the angular velocity vector in the body frame of reference, respectively, $$Bias_{b_{\omega_z}}$$

and $$Bias_{b_{\omega_y}}$$

are biases in the measurements of the z and y components of the angular velocity vector in the body frame of reference, respectively, $$\varepsilon_{b_{\omega_z}}$$

and $$\varepsilon_{b_{\omega_y}}$$

are the random noise of the rotational sensors with a mean value of zero.

To determine its bias estimate, the AABE 710 calculates the change or increment amounts of the elevation angle $\theta$ in a duration-varying time window from both filtered accelerometer data and filtered angular rate data. Then the AABE 710 compares these values (e.g., by taking a difference between them) to establish its dynamic bias estimate. The relationship between the angular velocity vector in the body frame of reference, $[{}^b\omega_x \; {}^b\omega_y \; {}^b\omega_z]^T$, and the rate of change of the Euler angles defined above, $[\dot\phi \; \dot\theta \; \dot\psi]^T$, is determined by resolving the Euler rates into the body coordinate frame as shown below.

$$\begin{bmatrix} {}^b\omega_x \\ {}^b\omega_y \\ {}^b\omega_z \end{bmatrix} = \begin{bmatrix} \dot\phi \\ 0 \\ 0 \end{bmatrix} + \begin{bmatrix} 1 & 0 & 0 \\ 0 & \cos\phi & \sin\phi \\ 0 & -\sin\phi & \cos\phi \end{bmatrix} \begin{bmatrix} 0 \\ \dot\theta \\ 0 \end{bmatrix} +$$

$$\begin{bmatrix} 1 & 0 & 0 \\ 0 & \cos\phi & \sin\phi \\ 0 & -\sin\phi & \cos\phi \end{bmatrix} \begin{bmatrix} \cos\theta & 0 & -\sin\theta \\ 0 & 1 & 0 \\ \sin\theta & 0 & \cos\theta \end{bmatrix} \begin{bmatrix} 0 \\ 0 \\ \dot\psi \end{bmatrix}$$

$$= \begin{bmatrix} 1 & 0 & -\sin\theta \\ 0 & \cos\phi & \sin\phi\cos\theta \\ 0 & -\sin\phi & \cos\phi\cos\theta \end{bmatrix} \begin{bmatrix} \dot\phi \\ \dot\theta \\ \dot\psi \end{bmatrix}$$

equivalently, $$\begin{bmatrix} \dot\phi \\ \dot\theta \\ \dot\psi \end{bmatrix} = \begin{bmatrix} 1 & \sin\phi\tan\theta & \cos\phi\tan\theta \\ 0 & \cos\phi & -\sin\phi \\ 0 & \frac{\sin\phi}{\cos\theta} & \frac{\cos\phi}{\cos\theta} \end{bmatrix} \begin{bmatrix} {}^b\omega_x \\ {}^b\omega_y \\ {}^b\omega_z \end{bmatrix}$$

Thus, the change rate of the elevation angle can be expressed as: $\dot\theta = \cos\phi \cdot {}^b\omega_y - \sin\phi \cdot {}^b\omega_z$. Using this framework, the total increment of elevation angle $\theta$ measured from the angular rate sensor site for a fixed time block with certain block size, is given as:

$$\Delta\hat\theta_{elevation} =$$

$$\Delta\theta_{elevation} + period \cdot \sum_{i=1}^{BlockSize} \left( -Bias_{b_{\omega_{z_i}}} \cdot \sin\phi_i + Bias_{b_{\omega_{y_i}}} \cdot \cos\phi_i \right) +$$

$$\ldots period \cdot \sum_{i=1}^{BlockSize} \left( -\varepsilon_{b_{\omega_{z_i}}} \cdot \sin\phi_i + \varepsilon_{b_{\omega_{y_i}}} \cdot \cos\phi_i \right)$$

where $\Delta\theta_{elevation}$ is the ideal of the increment of elevation angle in the given time window, $\phi$ is defined in the above Euler angle rotation sequence, subscript i denotes the time point when the ith sample arrives in the time block, BlockSize represents the total number of sample data points in the time block, and period is the sampling period. This calculation is performed by AABE 710 to establish the first value involved in the difference or comparison used to generate its bias estimate.

The total increment of elevation angle θ from the data generated by the accelerometer 700 is calculated by evaluating the difference between the start elevation angle at the first sample of the given time window and the end elevation angle at the last sample of the given time window as expressed, for example, below.

$$\Delta\hat{\theta}'_{elevation} = \hat{\theta}_{elevation@lastsample} - \hat{\theta}_{elevation@firstsample} = \Delta\theta_{elevation} + \varepsilon_{\Delta\hat{\theta}'_{elevation}}$$

$$\hat{\theta}_{elevation@currentSample} =$$

$$\begin{cases} \sin^{-1}\left(\frac{acc_{x@currentSample}}{\|A_g\|}\right) & 0.1447 \cdot \|A_g\| <= |acc_x| <= 0.9946 \cdot \|A_g\| \\ \tan^{-1}\left(\frac{acc_{x@currentSample}}{\|A_g\|^2 - acc_x^2}\right) & \text{otherwise,} \end{cases}$$

where $\varepsilon_{\Delta\hat{\theta}'_{elevation}}$ accounts for both the error caused by non-ignorable, non-gravity terms in accelerometer data and random noise with a mean of zero, $acc_x$ is the x-axis measurement of accelerometer, and $\|A_g\|$ is the amplitude of the localized earth gravity.

The difference in the calculations of the increments of the elevation angle is then calculated as:

$$Bias_{elevationAngle} = \Delta\hat{\theta}_{elevation} - \hat{\theta}'_{elevation}$$

$$= \left(Bias_{b_{\omega_z}} \cdot \sum_{i=1}^{BlockSize} -\sin\phi_i + Bias_{b_{\omega_y}} \cdot \sum_{i=1}^{BlockSize} \cos\phi_i\right) \cdot$$

$$period + period \cdot \sum_{i=1}^{BlockSize} \left(-\varepsilon_{b_{\omega_{z_i}}} \cdot \sin\phi_i + \varepsilon_{b_{\omega_{y_i}}} \cdot \cos\phi_i\right) -$$

$$\varepsilon_{\Delta\hat{\theta}'_{elevation}}$$

$$= \left(Bias_{b_{\omega_z}} \cdot \sum_{i=1}^{BlockSize} -\sin\phi_i + Bias_{b_{\omega_y}} \cdot \sum_{i=1}^{BlockSize} \cos\phi_i\right) \cdot$$

$$period + \varepsilon_{Bias_{elevationAngle}}$$

where $$\varepsilon_{Bias_{elevationAngle}} = period \cdot \sum_{i=1}^{BlockSize} \left(-\varepsilon_{b_{\omega_{z_i}}} \cdot \sin\phi_i + \varepsilon_{b_{\omega_{y_i}}} \cdot \cos\phi_i\right) - \varepsilon_{\Delta\hat{\theta}'_{elevation}}$$

This bias estimate generated by the AABE 710 can then be normalized by dividing it by the time-duration of the time window, and the resulting output of AABE 710, referred to herein as an "estimated bias of pitch angular rate" is:

$$Bias_{PithAngularRate} =$$

$$ZRO_{b_{\omega_z}} \cdot \frac{\sum_{i=1}^{BlockSize} -\sin\phi_i}{Blocksize} + ZRO_{b_{\omega_y}} \cdot \frac{\sum_{i=1}^{BlockSize} \cos\phi_i}{Blocksize} + \frac{\varepsilon_{Bias_{elevationAngle}}}{Blocksize \cdot period},$$

where $$\phi = \tan^{-1}\left(\frac{-acc_y}{-acc_z}\right),$$

$acc_y$ and $acc_z$ are the y-axis and z-axis measurements of accelerometer 700, respectively. The AABE 710 also adaptively calculates the variance of the associated measurement error $$\frac{\varepsilon_{Bias_{elevationAngle}}}{Blocksize \cdot period}$$

based on the real-time sensors' data error propagation, and this variance along with the bias estimate are output from AABE 710 to the combiner 716.

The durations of the time windows used by the AABE 710 can be determined based upon both (1) whether the measurement noise of the current accelerometer sample is below a predetermined threshold and (2) whether the averaged measurement noise of the current calculated pitch angular rate bias over the window is below the threshold. A minimum time duration can be enforced as the lower bound on window duration to ensure measurement validity/quality. According to exemplary embodiments, a new AABE window is not initialized until a sufficiently "good" accelerometer sample, in the sense of noise and distortion, arrives. The distortion and/or noise are calculated using error propagation based on the sensor's noise level and modeling of human's tremor effect. The AABE time window can also be reset, for example, when one of the following conditions occurs: a maximum pitch of the device is exceeded, the filter 720 has not yet initialized, there is too much measurement noise, there are too many missing samples, too much change in the roll angle (Φ) in the body frame of reference has occurred over the window or the time window has grown too large.

According to exemplary embodiments, there are three different modes in which the AABE 710 can provide bias estimates to the combiner 716. The first is to provide the bias estimates described above as individual data points which will converge over time. This first mode is referred to herein as "1D Pitch mode". However, under certain circumstances, AABE 710 can provide estimates in one of two other modes which may provide very quick and accurate bias estimates, e.g., at power-on of the device, by using a line intersection technique to attempt to more rapidly converge on the "best" bias estimate. These two additional modes are referred to herein as "2D line intersection mode" and "2D pseudo-line intersection mode".

The 2D line intersection mode operates using two 1D Pitch mode AABE bias estimates together, i.e., a first estimate at time t and a second estimate at time t+1, to obtain a better estimate. For example, assume that a user rolls the device (i.e., rotates it about the x-axis) between time t and time t+1. Then, the first 1D Pitch mode bias estimate provides an estimate of the bias in one direction and the second 1D Pitch mode bias estimate provides an estimate of the bias in another direction. The intersection of these two lines provides an accurate and quick estimate of the set of $$Bias_{b_{\omega_y}}$$

and $$Bias_{b_{\omega_z}}$$

simultaneously. Thus when operating in 2D line intersection mode the AABE 710 sends two adjacent measurements of biases of pitch angular rates at two different roll angles, and their associated measurement error covariances, together to the estimate combiner 716.

The 2D pseudo-line intersection mode can, according to this exemplary embodiment, be considered as a special case of the 2D line intersection mode. In certain circumstances, e.g., when the 3D pointing device is not moving or is moving very slowly, AABE 710 can map the averaged values of angular rate sensor's data over the current time window into the bias of the yaw angular rate defined in user frame. This mapping can be performed, for example, as follows:

$$Bias_{YawAngularRate} = \frac{Bias_{b_{\omega_y}} \cdot \sum_{i=1}^{BlockSize} \sin\phi_i + Bias_{b_{\omega_z}} \cdot \sum_{i=1}^{BlockSize} \cos\phi_i}{BlockSize} \cong$$

$$\frac{\sum_{i=1}^{BlockSize} \sin\phi_i \cdot {}^b\hat{\omega}_{y_i} + \cos\phi_i \cdot {}^b\hat{\omega}_{z_i}}{BlockSize}$$

The mathematical equation of this measured bias of yaw angular rate along with the mathematical equation of the estimated bias of pitch angular rate together form two lines perpendicular with each other in geometry space. The intersection of those two lines also provides a quick estimate of the set of $$Bias_{b_{\omega_y}}$$

and $$Bias_{b_{\omega_z}}$$

simultaneously. With their real-time calculated measurement error covariance, this measured bias of yaw angular rate and the estimated bias of pitch angular rate are sent to estimate combiner 716 as the input from AABE 710. The measurement error variance of the bias of yaw angular rate used in the 2D pseudo-line intersection mode can be weighted less over time.

Figure 9:
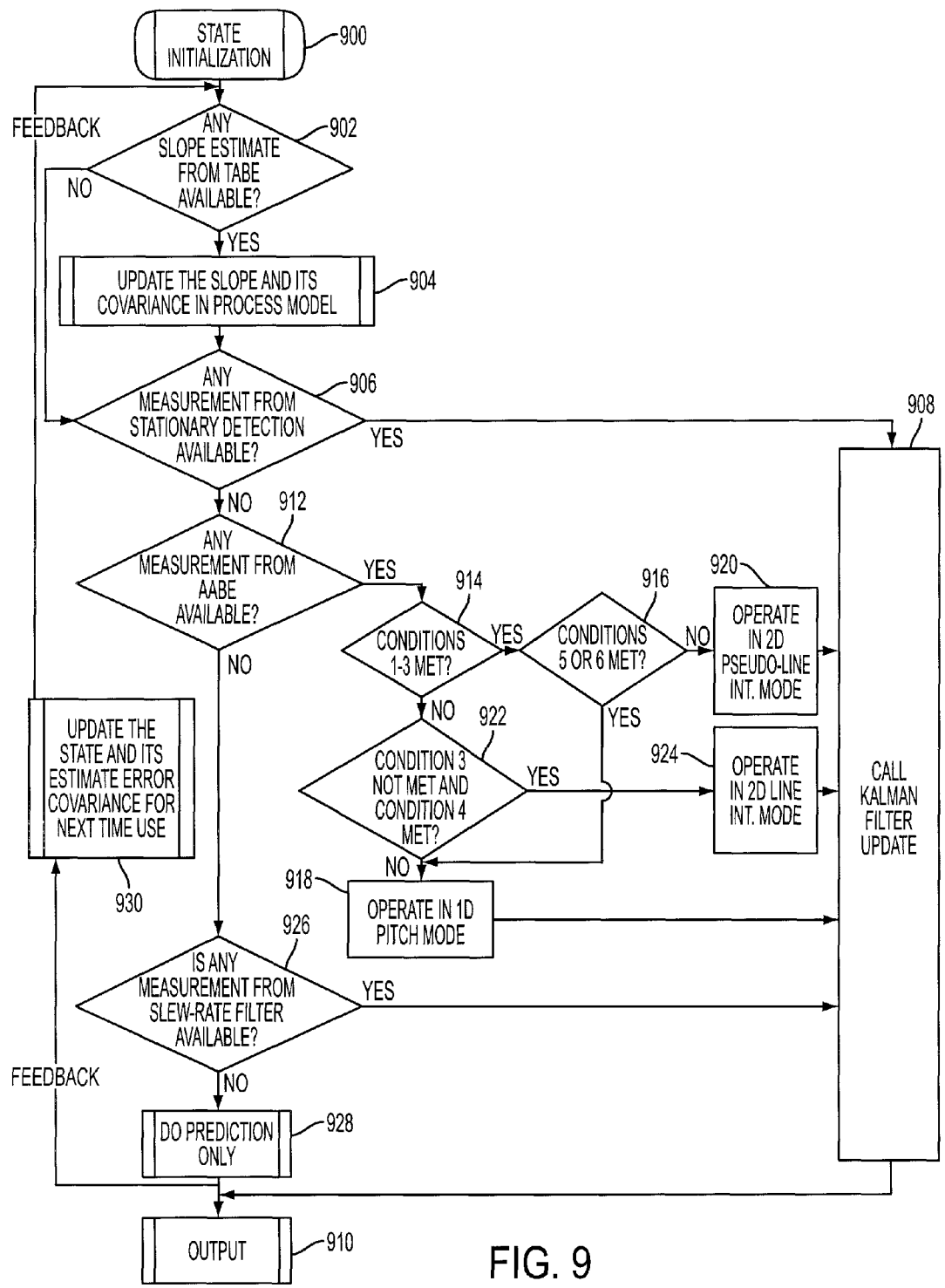
FIG. 9 is a flow chart illustrating a method of bias estimation according to an exemplary embodiment.

The decision regarding in which of these three modes the AABE 710 should operate at any given time can, according to one exemplary embodiment, be made as follows. This flow is also described below with respect to FIG. 9. If three exemplary criteria are met, then AABE 710 can operate in 2D pseudo-line intersection mode. These three exemplary criteria are (1) if the measurement error variance corresponding to the current estimated bias of the pitch angular rate is smaller than a predetermined threshold, (2) if the time window size (BlockSize) is short enough and (3) if the difference of the measured body-frame roll angles (0) in the current time window and in the previous time window is small enough. If these three criteria are not all met, then the AABE 710 can operate in the 2D line intersection mode if condition (3) is not met and if another condition (4) is met. Condition (4) requires that the time gap between the last time window and current time window is shorter than a predetermined amount of time.

If neither of these sets of conditions is met, then AABE 710 operates in 1D Pitch mode. Additionally, if either of the conditions (5) and (6) is met, then AABE 710 will also operate in 1D Pitch mode. Conditions (5) and (6), according to this exemplary embodiment, are (5) if the difference between a newest estimate of bias using the 2D pseudo-line intersection mode and the previous best estimate of estimate combiner 716 is greater than k*sqrt(P), where k is a pre-defined constant factor, P is the final bias estimate error covariance and (6) if the slope estimate in the TABE 714 is available and used in estimate combiner when the AABE is not operating in 2D line-intersection mode. All of the above conditions or criteria used to determine in which mode the AABE 710 shall operate can be compared with pre-calculated thresholds, some of which may be constant and some of which may decay over time using, e.g., a single exponential decay model or a double exponential decay model when the nature of the change rate of the bias is slowing down over time. It should be further appreciated that these algorithms can be run on each axis independently and, potentially, on each axis simultaneously, e.g., assuming that any axis is the pitch axis instead of just the x-axis as is described in some of these exemplary embodiments.

The AABE 710 provides accurate and fast bias estimates for the pitch direction, but does not directly measure the yaw bias as mentioned above. It should be further appreciated that AABE 710 can be extended to also measure the roll bias, and that AABE algorithm 710 can be run on each axis (roll or pitch) independently and on both axes (roll and pitch) simultaneously. Accordingly, the slew-rate filter 714 provides a third technique for estimating bias according to this exemplary embodiment. This technique, which can be independent of the other bias estimation techniques described herein, operates on the assumption that the rate of change of the amount of bias introduced by the rotational sensor 702 will vary within a predetermined range, which range is a function of the temperature of the device. That is, the rate of change in the bias error is bounded by the rate of change in temperature of the device. The angular rate sensor data is first, optionally, processed by a low pass filter 722 before flowing into the slew-rate filter 712. The operation of the slew-rate filter 712 can be defined by the following equation:

$$y = \{B: x > B, x: -B < x < B, -B: x < -B;\},$$

where x is the input, y is the output, and B is the slew-rate filter threshold. For this exemplary embodiment, x is therefore the angular rate output from the low pass filter 722 minus the current angular rate bias estimate fed back from the estimate combiner 716. The output y plus the current angular rate bias estimate is the next estimate for the angular rate bias to be output from the slew-rate filter 712 to the combiner 716.

The threshold value, B, used by the slew-rate filter 712 is periodically adaptively calculated based on the real-time temperature change rate and the bias temperature slope estimate. The upper bound and the lower bound are enforced on such threshold. In this exemplary embodiment, B is calculated as follows:

$$B(t_n) = \begin{cases} k \cdot slope(t_n) \cdot \Delta T / \Delta t & \text{otherwise} \\ B_{max} & k \cdot slope(t_n) \cdot \Delta T / \Delta t > B_{max} \\ B_{min} & k \cdot slope(t_n) \cdot \Delta T / \Delta t < B_{min}, \end{cases}$$

where k is a constant, $B_{max}$ is the upper bound of B, $B_{min}$ is the lower bound of B, slope($t_n$) is the estimated slope at time step n denoted by $t_n$, and $\Delta T/\Delta t$ is the temperature change rate.

The fourth technique used to estimate bias according to this exemplary embodiment is performed by the temperature assisted bias estimation function (TABE) 714. This technique correlates the change in temperature of the device to the change of the bias introduced by the rotational sensor(s) 702. According to this exemplary embodiment, the TABE 714 uses the model:

Bias=slope(t)*T+intercept(t), where T (in units of degrees Centigrade) is the raw temperature measurement after decoupling both z and y channels of the angular rate data using the best current estimate of bias available but before temperature smoothing, slope(t) is the change of bias per unit temperature as a function of time, intercept(t) is the bias at a temperature of zero as a function of time and t is the time.

Figure 8B:
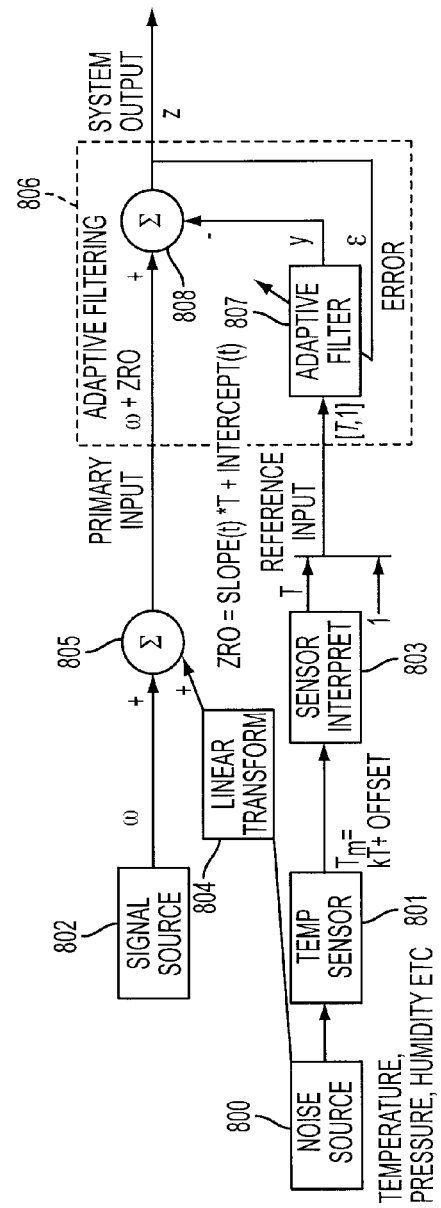
FIG. 8(b) illustrates an exemplary recursive least squares (RLS) algorithm which can be used according to an exemplary embodiment.

According to this exemplary embodiment, a recursive least-squared (RLS) method and algorithm is used to adaptively learn and track the slope(t) and intercept(t), an example of which RLS algorithm is illustrated in FIG. 8(*b*). The adaptive filtering part of this exemplary RLS algorithm is shown as adaptive filtering block 806. The reference input to the adaptive filtering are measurements from the temperature sensor 801 (also shown as temperature sensor 706 in FIG. 7), complemented with a unit constant of 1, the vector of [T, 1], shown as the input to adaptive filter block 807 in FIG. 8(*b*). This vector represents a sensed temperature after interpretation (e.g., in units of degrees Celsius) as well as other factors, e.g., pressure and humidity all of which are collectively identified as "noise source" 800, related to temperature which may impact the bias and which are represented in this example by the unit constant of 1. The measured temperature $T_M$ of sensor 801 is first interpreted in block 803 (also shown as part of sensor interpret block 704 in FIG. 7) and yields the estimate of the true temperature T. This true temperature is at least one cause of angular rate sensor 702's bias, which is linearly transformed (matrix multiplied) and coupled into bias (ZRO) of angular rate sensor(s) 702 using the above equation at block 804. The other possible root causes of angular rate sensor's bias, such as pressure and humidity etc., are coupled into the ZRO in the forms of slope(t) and intercept (t). The ZRO value is input to summer 805 and added to the desired signal ω (source signal 802) which is the angular rate data in units of rad/s, the summed value representing angular-rate measurement from angular rate sensor(s) 702 and also serving as the primary input to the adaptive filtering block 806. The adaptive filtering block 806 can, for example, operate as described below.

The adaptive filter 807 adaptively adjusts the coefficient vector:

$$\vec{W}(t_n) = [w_1(t_n) w_2(t_n)] = [\text{slope}(t_n) \text{intercept}(t_n)]$$

and yields the output $$y = \vec{W}(t_n) \otimes \begin{bmatrix} T(t_n) \\ 1 \end{bmatrix} = [\text{slope}(t_n) \quad \text{intercept}(t_n)] \otimes \begin{bmatrix} T(t_n) \\ 1 \end{bmatrix},$$

wherein $t_n$ denotes time step n, and ⊗ denotes matrix multiplication. In this exemplary implementation, only one of the coefficients of the adaptive filter, slope($t_n$), is directed to the downstream combiner 808. However, the output y itself can be used for the bias estimate alone. The coefficients $\vec{W}(t_n)$ are updated at each time step using the RLS algorithm which can, for example, be performed as follows. First, the RLS algorithm is initialized by setting:

$$\vec{W}(t_n) = [0 \ 0],$$

$$P(0) = \begin{bmatrix} \delta^{-1} & 0 \\ 0 & \delta^{-1} \end{bmatrix}$$

and $$\delta = \begin{cases} \text{small positive constant for high } SNR \\ \text{large positive constant for high } SNR \end{cases}$$

where $\vec{W}$ is the vector of filter coefficients and P is the inverse of the instant correlation matrix. Then, for each instant of time step $t_n$, compute:

$$\vec{\pi}(t_n) = P(t_{n-1}) \otimes \vec{u}(t_n),$$

$$\vec{k}(t_n) = \frac{\vec{\pi}(t_n)}{\lambda + \vec{u}^T(t_n) \otimes \vec{\pi}(t_n)},$$

$$\xi(t_n) = d(t_n) - \vec{W}^T(t_n) \otimes \vec{u}(t_n),$$

$$\vec{W}(t_n) = \vec{W}(t_{n-1}) + \vec{k}(t_n)\xi(t_n),$$

$$P(t_n) = \lambda^{-1} P(t_{n-1}) - \lambda^{-1} \vec{k}(t_n) \otimes \vec{u}^T(t_n) \otimes P(t_{n-1}),$$

where $$\vec{u}(t_n) = \begin{bmatrix} T(t_n) \\ 1 \end{bmatrix}$$

$$d(t_n) = \omega(t_n) + ZRO(t_n)$$

λ is a positive constant close to, but less than, unity, and ⊗ denotes matrix multiplication.

This exemplary implementation operates on the principle that minimizing the energy of the system output is equivalent to minimizing the difference between the ZRO and the output y of adaptive filter 807, which can be shown as follows:

$$z = \omega + \text{Bias} - y$$

$$z^2 = \omega^2 + (\text{Bias} - y)^2 + 2\omega(\text{Bias} - y)$$

$$E[z^2] = E[\omega^2] + E[(\text{Bias} - y)^2] + 2E[\omega \cdot (\text{Bias} - y)]$$

$$= E[\omega^2] + E[(\text{Bias} - y)^2]$$

$$\min E[z^2] = E[\omega^2] + \min E[(\text{Bias} - y)^2],$$

where z is the system output, and y is the output of adaptive filter 807.

In this exemplary implementation, the angular rate output from the sensor(s) 702 may couple into the temperature signals from the temperature sensor 706 which can cause difficulties for the RLS algorithm. This coupling mechanism can be minimized by providing a fading effect over the first several samples of the RLS algorithm. The fading effect can be calculated based on the magnitude of the rotation motion using the best knowledge about angular rate bias up to that point in time. The adaptive learned slope(t) is further evaluated by comparing its dynamic range (peak-to-peak value) in a time window of predefined length with a certain threshold, if the adaptive learned slope is stable enough, this estimated slope and its associated estimated error variance will be sent to the estimate combiner and the slew-rate filter. The associated estimated error variance can be calculated using the standard deviation over the time window or using the peak-to-peak value over the time window itself. A lower bound on the error can be provided due to the nature of the hysteresis of the bias shift. It should be further appreciated that both slew-rate filter 712 and TABE algorithm 714 can be run on each axis independently and/or on both axes simultaneously.

The outputs of the four bias estimation functions 708-714, as well as the filtered temperature data, are provided to the estimate combiner 716 which uses that information to generate a current bias estimate. The combiner 716 can be implemented, for example, using a Kalman filter infrastructure which synthesizes all of the measurements available from the stationary detector, slew-rate filter, the accelerometer-assisted estimator and the temperature-assisted estimator. The process model used in this exemplary embodiment is random walk with the worst dynamics assumption if the slope estimation is not available from TABE 714. The process model is changed to a linear temperature-based model if the slope estimation is available from TABE 714. The state of the Kalman filter used as an estimate combiner 716 according to this exemplary embodiment can be expressed as:

$$\overline{X} = \begin{bmatrix} Bias_{b_{\omega_y}} & Bias_{b_{\omega_z}} \end{bmatrix}.$$

The process model of the Kalman filter used as estimate combiner 716 according to this exemplary embodiment can be expressed as:

$$\overline{X}_{t_{n+1}|t_n} = \overline{X}_{t_n} + \left(\frac{\text{slope}(t_n) + \text{slope}(t_{n+1})}{2}\right) \cdot \Delta T + \overline{W}_{t_n}$$

$$\Delta T = FiltT(t_{n+1}) - FiltT(t_n)$$

where $\overline{X}_{t_{n+1}|t_n}$ is the predicted bias estimate vector at time $t_{n+1}$ given the measurements up to time $t_n$, $\overline{X}_{t_n}$ is the final bias estimate vector at time $t_n$, slope($t_n$) and slope($t_{n+1}$) are the slopes learned from TABE 714 at time $t_n$ and $t_{n+1}$, respectively, if such data is available (in the exemplary embodiments described above there are two channels, y and z, so the slopes can be described using a 2×1 column vector), FiltT($t_n$) and FiltT($t_{n+1}$) are the filtered temperature estimate at time $t_n$ and $t_{n+1}$, respectively, $\Delta T$ is the temperature change between a current filtered temperature estimate FiltT($t_{n+1}$) and a last filtered temperature estimate FiltT($t_n$) associated with the last time at which the Kalman filter was executed, and $\overline{W}_{t_n}$ is the error with zero mean and covariance 2×2 matrix Q. If the slope estimation is not available from TABE 714, then the slope values can be set to zero.

The process error covariance is calculated as:

$$Q = R_{slope} \cdot (\Delta T^2 + R_{\Delta T}) + R_{\Delta T} \cdot k \cdot \text{slope} \otimes \text{slope}^T$$

$$\Delta T = FiltT(t_{n+1}) - FiltT(t_n),$$

where:

⊗ represents the matrix product, $R_{slope}$ is a 2×2 slope estimate error covariance matrix accounting for both y-axis and z-axis components which are also provided by TABE 714 if such data is available, $\Delta T$ is the temperature change between a current filtered temperature estimate FiltT($t_{n+1}$) and a last filtered temperature estimate FiltT($t_n$), i.e., corresponding to the last time that the Kalman filter was executed, $R_{\Delta T}$ is the estimate error variance of the estimate of $\Delta T$, and k is a 2×2 correlation coefficients matrix.

When the slope estimation is not available from the TABE 714, the slope value used in this calculation is set to [0;0] and the $R_{slope}$ value is set to be the worst dynamic range bounded by the value across all of the sensor set.

The predicted estimate error covariance associated with the Kalman filter according to this exemplary embodiment can be expressed as:

$$P_{t_{n+1}|t_n} = P_{t_n} + Q,$$

where:

$P_{t_{n+1}|t_n}$ is the predicted bias estimate error covariance at time $t_{n+1}$ given the measurements up to time $t_n$, and $P_{t_n}$ is the final bias estimate error covariance at time $t_n$.

The measurement model associated with the Kalman filter can be expressed as:

$$\{\overline{M}(t_{n+1}) = H(t_{n+1}) \otimes \overline{X}(t_{n+1}) + \overline{U}_{t_{n+1}},$$

where $\overline{M}(t_{n+1})$ is the measurement set in terms of column vector at time step $t_{n+1}$, $\overline{U}_{t_{n+1}}$ is the measurement error at time $t_{n+1}$ with mean of zero and covariance of R, $H(t_{n+1})$ is the transfer matrix at time $t_{n+1}$.

$$\overline{M}_{t_{n+1}} = \begin{cases} \begin{bmatrix} Bias_{b_{\omega_y}}(t_{n+1}) \\ Bias_{b_{\omega_z}}(t_{n+1}) \end{bmatrix} & \text{the output from stationary detector 708 or slew-rate filter 712} \\ \begin{bmatrix} Bias_{pitchAngularRate}(t_{n+1}) \\ Bias_{yawAngularRate}(t_{n+1}) \end{bmatrix} & \text{the output from the AABE710 using 2D pseudo-line intersection mode} \\ \begin{bmatrix} Bias_{pitchAngularRate}(t_{n+1}) \\ Bias_{yawAngularRate}(t_n) \end{bmatrix} & \text{the output from the AABE710 using 2D line intersection mode} \\ Bias_{pitchAngularRate}(t_{n+1}) & \text{the output from the AABE710 using 1D pitch mode} \end{cases}$$

$$H_{t_{n+1}} = \begin{cases} \begin{bmatrix} 1 & 0 \\ 0 & 1 \end{bmatrix} & \text{associated with stationary detector 708 or slew-rate filter 712} \\ \begin{bmatrix} \cos\phi(t_{n+1}) & -\sin\phi(t_{n+1}) \\ \sin\phi(t_{n+1}) & \cos\phi(t_{n+1}) \end{bmatrix} & \text{associated with 2D pseudo-line intersection mode of AABE710} \\ \begin{bmatrix} \cos\phi(t_{n+1}) & -\sin\phi(t_{n+1}) \\ \cos\phi(t_n) & -\sin\phi(t_n) \end{bmatrix} & \text{associated with 2D line intersection mode of AABE710} \\ [\cos\phi(t_{n+1}) & -\sin\phi(t_{n+1})] & \text{associated with 1D pitch mode of AABE710} \end{cases}$$

where ρ denotes correlation coefficient.

Thus, the updated final bias estimate output by the estimate combiner (Kalman filter) 716, and its error covariance, according to this exemplary embodiment are given as:

$$Z_{t_{n+1}} = H_{t_{n+1}} X_{t_{n+1}/t_n}$$

$$r_{t_{n+1}} = M_{t_{n+1}} - Z_{t_{n+1}}$$

$$S_{t_{n+1}} = H_{t_{n+1}} P_{t_{n+1}/t_n} H_{t_{n+1}}^T + R_{t_{n+1}}$$

$$K_{t_{n+1}} = P_{t_{n+1}/t_n} H_{t_{n+1}}^T S_{t_{n+1}}^{-1}$$

$$X_{t_{n+1}/t_{n+1}} = X_{t_{n+1}/t_n} + K_{t_{n+1}} r_{t_{n+1}}$$

$$P_{t_{n+1}/t_{n+1}} = P_{t_{n+1}/t_n} - P_{t_{n+1}/t_n} H_{t_{n+1}}^T S_{t_{n+1}}^{-1} H_{t_{n+1}} P_{t_{n+1}/t_n},$$

where $X_{t_{n+1}/t_{n+1}}$ is the final bias estimate at time $t_{n+1}$ given the measurement up to time $t_{n+1}$, $X_{t_{n+1}/t_n}$ is the predicted bias estimate at time $t_{n+1}$ given the measurement up to time $t_n$, and $P_{t_{n+1}/t_n}$ is the final bias estimate error covariance at time $t_{n+1}$ given the measurement up to time $t_{n+1}$.

The individual bias estimate models described above which provide input to the Kalman filter can be serviced in priority order when available. For example, when only one measurement set is available, then the method reduces to a single constraint at a time. If, on the other hand, more than one measurement set is available at a particular time step, according to one exemplary embodiment, only one of the measurement sets will be executed by the Kalman filter based on, for example, the following priority order: stationary detector 708, AABE 710, and slew-rate filter 712. This aspect and other features of bias estimation according to these exemplary embodiments can also be seen in the process flow chart of FIG. 9.

Therein, state initialization of the Kalman filter occurs at block 900. The rest of the flow illustrates the process of entering an update or prediction phase for the Kalman filter for a particular time step. Since the TABE 714 is, according to this exemplary embodiment, the highest ranked of the bias estimators (i.e., the process model is changed to a linear temperature-based model if the slope estimation is available from TABE 714), it is first determined at block 902 whether slope estimate data is currently available from TABE 714. If so, then the linear temperature-based model is used, and the slope and its associated error covariance are updated at block 904. If not, the flow moves to block 906, wherein it is determined whether a stationary detection indication is available. If so, then the Kalman filter update process described above is called at block 908. The Kalman filter then updates its state based on the indication that the 3D pointing device is stationary and the output of the rotational sensor(s) 702 are indicative of the current bias which they are introducing. The flow then proceeds to generate an output bias estimate at block 910.

Otherwise, if the determination at block 906 is "No", i.e., the device is not stationary, then the flow proceeds to block 912. Therein, it is determined whether data is available to generate an output from AABE 710 as described above. If the answer is "Yes", then the flow proceeds to block 914 wherein the process begins to determine which of the three aforedescribed modes of operation should be used by the AABE 710 to present bias estimation data to the Kalman filter. For example, if conditions (1)-(3) described above are met then, according to this exemplary embodiment, the possibility exists to use the 2D pseudo-line intersection mode to provide bias estimation data to the Kalman filter and the flow proceeds to block 916. Block 916 determines whether any of the negative conditions (5) and (6) described above are present, i.e., whether (5) the difference between a newest estimate of bias using the 2D pseudo-line intersection mode and the previous best estimate of block 908 is greater than k*sqrt(P), where k is a pre-defined constant factor and P is the final bias estimate error covariance or (6) the slope estimate in the TABE 714 is available and used in the Kalman filter. If either of these negative conditions is present, then the flow follows the "Yes" path and moves to block 918 and the AABE 710 provides bias estimation data using the 1D Pitch mode described above to be used in updating the state of the Kalman filter at block 908. Otherwise the flow follows the "No" path out of block 916 to block 920 where the bias estimation data is then calculated using the 2D pseudo-line intersection mode and presented to the Kalman filter update block 908.

Returning to block 914, if any of conditions (1)-(3) are not met, then the flow follows the "No" path to block 922. At this block it is determined whether condition (3) described above is not met and whether condition (4) is met, thereby permitting the AABE to provide bias estimation data to the Kalman filter update block 908 using the 2D line intersection mode. This is shown by block 924. If these criteria are not met, then the flow follows the "No" path to block 918 and the processing using 1D Pitch mode continues as described above.

Returning to block 912, if a measurement is not available from the AABE 710, then the flow follows the "No" path to block 926. Therein, it is determined whether a measurement is available from the slew-rate filter 712. If so, then bias estimation data from the slew-rate filter 712 is presented to the Kalman filter update call 908 to update the state of the Kalman filter based on that data via the "Yes" path. Otherwise, if none of the four bias estimation techniques described above have measurements available during a particular timestep (iteration), then the flow proceeds to block 928 wherein a prediction phase is performed for the Kalman filter (rather than an update). The prediction phase uses the state estimate from the previous timestep to produce an estimate of the state at the current timestep (i.e., but without measurement data as in the update call 908). This estimated state is then used to drive the bias estimate output at block 910, i.e., either after the prediction phase or the update phase of the Kalman filter. The updated state and associated error covariance are then used in the next timestep as indicated by block 930. According to exemplary embodiments, the output from block 910 can be used in several ways. For example, as shown in FIG. 7, the output can be fed back with, e.g., one sample delay at blocks 724 and 726, to the TABE 714 and sensor interpretation block 704/slew rate filter 712, respectively, to improve their estimates during the next timestep.

Moreover, the estimated bias of the rotational sensor(s) 702, as well as its associated temperature and the estimated slopes (if they are available from the TABE 714) can be stored in flash memory 1001 (described below with respect to FIG. 10) on the embedded hardware as dynamic calibration data for preparation of a next-time system power cycle use. For example, the next time the 3D pointer system is powered on, and if such information is available from flash memory 1001, this information will be fed back to the estimate combiner 716 as the initial estimate of the bias, to the temperature filter 707 for better angular-rate decoupling, and to the slew-rate filter 712 as the initial current bias estimate. This information can also help to reduce the dynamic range the system needs to handle by better refining Q in the Kalman filter.

Figure 10:
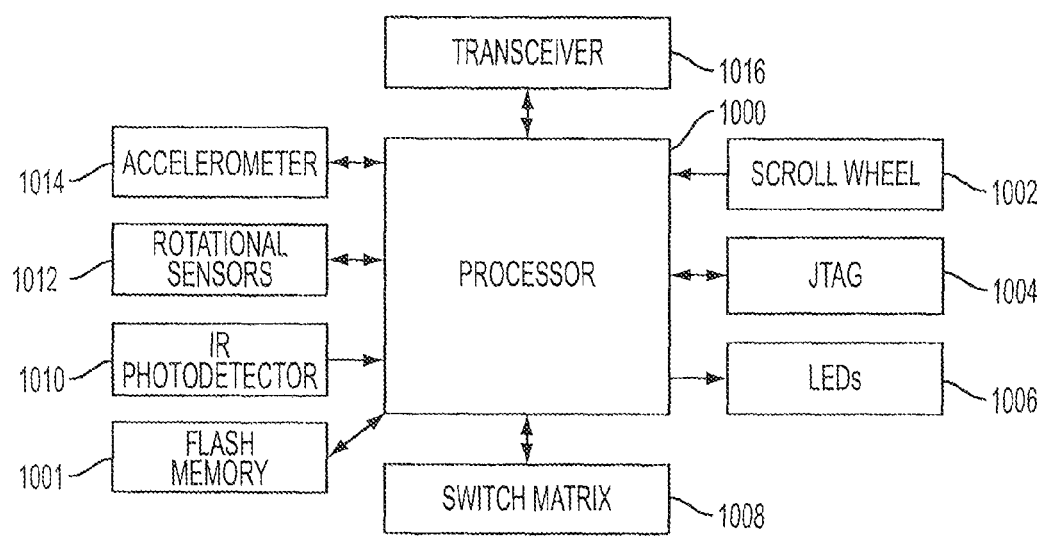
FIG. 10 illustrates hardware elements of a 3D pointing device according to an exemplary embodiment.

Having provided a description of bias estimation in exemplary 3D pointing devices according to the afore-described exemplary embodiments, FIG. 10 illustrates an exemplary hardware architecture associated with such 3D pointing devices. Therein, a processor 1000 communicates with other elements of the 3D pointing device including a flash memory 1001, scroll wheel 1002, JTAG 1004, LEDs 1006, switch matrix 1008, IR photodetector 1010, rotational sensor(s) 1012, accelerometer 1014 and transceiver 1016. The flash memory device 1001 can be used by processor 1000 to store various programs and/or data for use in operating the 3D pointing device, e.g., bias estimates as described above. The scroll wheel 1002 is an optional input component which enables a user to provide input to the interface by rotating the scroll wheel 1002 clockwise or counterclockwise. JTAG 1004 provides the programming and debugging interface to the processor. LEDs 1006 provide visual feedback to a user, for example, when a button is pressed. Switch matrix 1008 receives inputs, e.g., indications that a button on the 3D pointing device has been depressed or released, that are then passed on to processor 1000. The optional IR photodetector 1010 can be provided to enable the exemplary free space pointing device to learn IR codes from other remote controls. Rotational sensors 1012 provide readings to processor 1000 regarding, e.g., the y-axis and z-axis rotation (angular rate) of the 3D pointing device as described above. Accelerometer 1014 provides readings to processor 100 regarding the linear acceleration of the 3D pointing device which can be used, e.g., to perform tilt compensation and to compensate for errors which linear acceleration introduces into the rotational readings generated by rotational sensor(s) 1012. Transceiver 1016 is used to communicate information to and from 3D pointing device, e.g., to the system controller 228 or to a processor associated with a computer. The transceiver 1016 can be a wireless transceiver, e.g., operating in accordance with the Bluetooth standards for short-range wireless communication or an infrared transceiver. Alternatively, 3D pointing device according to these exemplary embodiments can communicate with systems via a wireline connection.

The individual bias estimators described above can be used and applied independently of one another or in different combinations. As mentioned above, although the afore-described exemplary embodiments combine all four of the outputs to yield an improved estimate for a particular (yet exemplary) implementation, those skilled in the art will recognize that each produces an independent estimate and can be used with (or without) the others. More specifically, and for completeness, exemplary embodiments contemplate each combination of rate estimators listed in the table below. This list is not, however, intended to be exhaustive.

| Combination | Type(s) of Bias Estimators |
|---|---|
| 1 | AABE Only |
| 2 | Slew-Rate Filter Only |
| 3 | TABE Only |
| 4 | AABE and Stationary Detection |
| 5 | AABE and Slew-Rate Filter |
| 6 | AABE and TABE |
| 7 | AABE, Stationary Detection and Slew-Rate Filter |
| 8 | AABE, Stationary Detection and TABE |
| 9 | AABE, Slew-Rate Filter and TABE |
| 10 | Stationary Detection, Slew-Rate Filter and TABE |
| 11 | Stationary Detection and Slew-Rate |
| 12 | Stationary Detection and TABE |
| 13 | TABE and Slew-Rate Filter |
| 14 | AABE, Stationary Detection, TABE and Slew-Rate Filter |

Additionally, although the foregoing exemplary embodiments describe a specific, yet purely exemplary, Kalman filter operating as an estimate combiner, it will be appreciated that other mechanisms can be used to combine or select the bias estimates output from the plurality of bias estimators in any given exemplary embodiment (if more than one bias estimator is employed). Moreover, the exemplary processing described herein may be performed, in whole or in part, either within the 3D pointing device itself or outside of the 3D pointing device. For example, raw sensor data can be transmitted to a system processor, e.g., within a set-top box or a computer, wherein it can then be processed to output a bias estimate and use that bias estimate as part of the larger processing scheme to determine motion of the 3D pointing device and use such information, e.g., to update cursor position associated with a cursor displayed on a user interface screen. The bias estimate described herein can, for example, be subtracted from an initial measurement of angular rate by the rotational sensor(s) 702, e.g., after a static calibration as a function of temperature has been performed.

Systems and methods for processing data according to exemplary embodiments of the present invention can be performed by one or more processors executing sequences of instructions contained in a memory device. Such instructions may be read into the memory device from other computer-readable mediums such as secondary data storage device(s). Execution of the sequences of instructions contained in the memory device causes the processor to operate, for example, as described above. In alternative embodiments, hard-wire circuitry may be used in place of or in combination with software instructions to implement the present invention. Such software may run on a processor which is housed within the device, e.g., a 3D pointing device or other device, which contains the sensors or the software may run on a processor or computer housed within another device, e.g., a system controller, a game console, a personal computer, etc., which is in communication with the device containing the sensors. In such a case, data may be transferred via wireline or wirelessly between the device containing the sensors and the device containing the processor which runs the software which performs the bias estimation and compensation as described above. According to other exemplary embodiments, some of the processing described above with respect to bias estimation may be performed in the device containing the sensors, while the remainder of the processing is performed in a second device after receipt of the partially processed data from the device containing the sensors.

Although the foregoing exemplary embodiments relate to sensing packages including one or more rotational sensors and an accelerometer, bias estimation techniques according to these exemplary embodiments are not limited to only these types of sensors. Instead bias estimation techniques as described herein can be applied to devices which include, for example, only accelerometer(s), optical and inertial sensors (e.g., a rotational sensor, a gyroscope or an accelerometer), a magnetometer and an inertial sensor (e.g., a rotational sensor, a gyroscope or an accelerometer), a magnetometer and an optical sensor, or other sensor combinations. Additionally, although exemplary embodiments described herein relate to bias estimation in the context of 3D pointing devices and applications, such techniques are not so limited and may be employed in methods and devices associated with other applications, e.g., medical applications, gaming, cameras, military applications, etc.

The above-described exemplary embodiments are intended to be illustrative in all respects, rather than restrictive, of the present invention. Thus the present invention is capable of many variations in detailed implementation that can be derived from the description contained herein by a person skilled in the art. For example, although the foregoing exemplary embodiments describe, among other things, the use of inertial sensors to detect movement of a device, other types of sensors (e.g., ultrasound, magnetic or optical) can be used instead of, or in addition to, inertial sensors in conjunction with the afore-described signal processing. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A 3-D pointing device for estimating bias associated with a sensor comprising:
    said sensor; and
    a processor for estimating said bias associated with said sensor using at least a first bias estimating technique to generate a first bias estimate and a second bias estimating technique to generate a second bias estimate.

2. The 3-D pointing device of claim 1, wherein said first bias estimate and said second bias estimate are associated with a non-zero value output from said sensor when said 3-D pointing device to which said sensor is attached is stationary.

3. The 3-D pointing device of claim 1, wherein one of said first bias estimate and said second bias estimate are selected to generate an output bias estimate.

4. The 3-D pointing device of claim 1, wherein said first bias estimating technique generates said first bias estimate based upon detection of a change in angle of said 3-D pointing device relative to one of a plurality of different axes.

5. The 3-D pointing device of claim 1, wherein said first bias estimating technique generates said first bias estimate based upon slew-rate filtering.

6. The 3-D pointing device of claim 1, wherein said sensor is a MEMS device.

7. The 3-D pointing device of claim 1, wherein said first bias estimate and said second bias estimate are combined to generate an output bias estimate.

8. The 3-D pointing device of claim 7, wherein said combining is performed by a Kalman filter to generate said output bias estimate.

9. The 3-D pointing device of claim 1, wherein said first bias estimating technique generates said first bias estimate based upon determining whether said 3-D pointing device within which said sensor is located is stationary.

10. The 3-D pointing device of claim 9, wherein said first bias estimating technique determines that said device is stationary when peak-to-peak values received from said sensor are less than a predetermined threshold.

11. The 3-D pointing device of claim 1, wherein said first bias estimating technique generates said first bias estimate based upon detection of a pitch of said 3-D pointing device within which said sensor is located.

12. The 3-D pointing device of claim 11, wherein said first bias estimate is determined over a variable time window, said variable time window varying based upon measurement noise associated with data generated by said sensor.

13. The 3-D pointing device of claim 11, wherein said first bias estimating technique operates in one mode to generate said first bias estimates as individual data points which converge over time.

14. The 3-D pointing device of claim 11, wherein said first bias estimating technique operates in one mode to generate said first bias estimates using a line intersection technique associated with two individual bias estimates by combining two measurements of biases of pitch angular rates at two different roll angles.

15. The 3-D pointing device of claim 11, wherein said first bias estimating technique operates in one mode to generate said first bias estimates by mapping averaged values output by said sensor into a bias of a yaw angular rate and a bias of a pitch angular rate defined in a user frame of reference.

16. The 3-D pointing device of claim 11, wherein said first bias estimating technique calculates a difference between a first change of elevation angle determined using data output from said sensor and a second change of elevation angle determined using data output from another sensor.

17. The 3-D pointing device of claim 16, wherein said sensor is an accelerometer and said another sensor is a sensor which measures rotation of said 3-D pointing device about an axis.

18. The 3-D pointing device of claim 11, wherein said first bias estimating technique operates in one of three modes to generate said first bias estimates including:
    (a) a first mode for generating said first bias estimates as individual data points which converge over time;
    (b) a second mode to generate said first bias estimates using a line intersection technique associated with two individual bias estimates; and
    (c) a third mode for generating said first bias estimates by mapping averaged values output by said sensor into a bias of a yaw angular rate and a bias of a pitch angular rate defined in a user frame of reference.

19. The 3-D pointing device of claim 18, wherein said first bias estimating technique operates in said third mode if (a) a measurement error variance associated with said first bias estimate is smaller than a first predetermined threshold, (b) a time window size over which said first bias estimate is calculated is smaller than a second predetermined threshold, and (c) a difference between a roll angle measured in a current time window and a roll angle measured in a previous time window is smaller than a third predetermined threshold.

20. The 3-D pointing device of claim 18, wherein said first bias estimating technique operates in said second mode if (a) a difference between a roll angle measured in a current time window and a roll angle measured in a previous time window is greater than a first predetermined threshold and (b) a time gap between a current time window and a previous time window is shorter than a predetermined amount of time.

* * * * *